(12) United States Patent
Blomberg

(10) Patent No.: US 9,062,390 B2
(45) Date of Patent: Jun. 23, 2015

(54) CRYSTALLINE STRONTIUM TITANATE AND METHODS OF FORMING THE SAME

(75) Inventor: Tom E. Blomberg, Vantaa (FI)

(73) Assignee: ASM International N.V. (NL)

( * ) Notice: Subject to any disclaimer, the term of this patent is extended or adjusted under 35 U.S.C. 154(b) by 0 days.

(21) Appl. No.: 13/609,725

(22) Filed: Sep. 11, 2012

(65) Prior Publication Data

US 2013/0108877 A1    May 2, 2013

Related U.S. Application Data

(60) Provisional application No. 61/533,715, filed on Sep. 12, 2011, provisional application No. 61/562,888, filed on Nov. 22, 2011, provisional application No. 61/647,638, filed on May 16, 2012.

(51) Int. Cl.
| | |
|---|---|
| *C30B 1/02* | (2006.01) |
| *C30B 25/18* | (2006.01) |
| *C30B 29/32* | (2006.01) |
| *C30B 29/68* | (2006.01) |

(52) U.S. Cl.
CPC ............... *C30B 1/02* (2013.01); *C30B 25/186* (2013.01); *C30B 29/32* (2013.01); *C30B 29/68* (2013.01)

(58) Field of Classification Search
CPC .......... C30B 1/02; C30B 29/68; C30B 29/32; C30B 25/186
USPC ...................... 117/4, 8, 9, 952, 109
See application file for complete search history.

(56) References Cited

U.S. PATENT DOCUMENTS

| | | | |
|---|---|---|---|
| 4,058,430 A | 11/1977 | Suntola et al. |
| 4,927,670 A | 5/1990 | Erbil |
| 5,225,561 A | 7/1993 | Kirlin et al. |
| 5,439,876 A | 8/1995 | Graf et al. |
| 5,453,494 A | 9/1995 | Kirlin et al. |
| 5,472,927 A | 12/1995 | Mulder et al. |
| 5,496,582 A | 3/1996 | Mizutani et al. |
| 5,617,290 A | 4/1997 | Kulwicki et al. |
| 5,711,811 A | 1/1998 | Suntola et al. |

(Continued)

FOREIGN PATENT DOCUMENTS

| | | |
|---|---|---|
| EP | 0 344 352 B1 | 12/1989 |
| FI | 108375 B | 1/2002 |

(Continued)

OTHER PUBLICATIONS

Ahn et al., "Electric field effect in correlated oxide systems", Nature, vol. 424, Aug. 28, 2003, pp. 1015-1018.

(Continued)

*Primary Examiner* — Bob M Kunemund
(74) *Attorney, Agent, or Firm* — Knobbe, Martens, Olson & Bear, LLP

(57) ABSTRACT

Methods of forming a crystalline strontium titanate layer may include providing a substrate with a crystal enhancement surface (e.g., Pt), depositing strontium titanate by atomic layer deposition, and conducting a post-deposition anneal to crystallize the strontium titanate. Large single crystal domains may be formed, laterally extending greater distances than the thickness of the strontium titanate and demonstrating greater ordering than the underlying crystal enhancement surface provided to initiate ALD. Functional oxides, particularly perovskite complex oxides, can be heteroepitaxially deposited over the crystallized STO.

18 Claims, 21 Drawing Sheets

(56) References Cited

U.S. PATENT DOCUMENTS

| | | | |
|---|---|---|---|
| 5,972,430 | A | 10/1999 | DiMeo, Jr. et al. |
| 6,020,024 | A | 2/2000 | Maiti et al. |
| 6,087,257 | A | 7/2000 | Park et al. |
| 6,099,904 | A | 8/2000 | Mak et al. |
| 6,144,060 | A | 11/2000 | Park et al. |
| 6,380,579 | B1 | 4/2002 | Nam et al. |
| 6,420,230 | B1 | 7/2002 | Derderian et al. |
| 6,444,592 | B1 | 9/2002 | Ballantine et al. |
| 6,583,057 | B1 | 6/2003 | Alluri et al. |
| 6,780,704 | B1 | 8/2004 | Raaijmakers et al. |
| 6,800,567 | B2 | 10/2004 | Cho |
| 2001/0024387 | A1 | 9/2001 | Raaijmakers et al. |
| 2002/0142588 | A1 | 10/2002 | Basceri et al. |
| 2002/0153579 | A1 | 10/2002 | Yamamoto |
| 2003/0176047 | A1 | 9/2003 | Doan et al. |
| 2004/0125541 | A1 | 7/2004 | Chung |
| 2005/0271813 | A1 | 12/2005 | Kher et al. |
| 2008/0072819 | A1 | 3/2008 | Rahtu et al. |
| 2011/0027960 | A1* | 2/2011 | Matz et al. ............ 438/381 |

FOREIGN PATENT DOCUMENTS

| | | |
|---|---|---|
| FR | 2 626 110 | 7/1989 |
| WO | WO 00/15865 | 3/2000 |

OTHER PUBLICATIONS

Biscaras et al., "Two-dimensional superconductivity at a Mott insulator/band insulator interface LaTiO$_3$/SrTiO$_3$", Nat. Communications, vol. 1, No. 89, (2010), pp. 1-5.

Farmakis et al., "On-Current Modeling of Large-Grain Polycrystalline Silicon Thin-Film Transistors", IEEE Transactions on Electron Devices, vol. 48, No. 4, Apr. 2001, pp. 701-706.

Gilbert et al., "Epitaxial growth of SrTiO$_3$ thin films by metalorganic chemical vapor deposition", Appl. Phys. Lett., vol. 66, No. 24, Jun. 12, 1995, pp. 3298-3300.

Hillert M., "On the Theory of Normal and Abnormal Grain Growth", Acta Metallurgica, vol. 13, Mar. 1965, pp. 227-238.

Mannhart et al., "Oxide Interfaces—An Opportunity for Electronics", Science, vol. 327, Mar. 26, 2010, pp. 1607-1611.

Nakagawara et al., "Effects of buffer layers in epitaxial growth of SrTiO$_3$ thin film on Si(100)", J. Appl. Phys., vol. 78, No. 12, Dec. 15, 1995, p. 7226-7230.

Niu et al., "Surface and interfacial structure of epitaxial SrTiO$_3$ thin films on (0 0 1) Si grown by molecular beam epitaxy", Journal of Crystal Growth, vol. 300, (2007), pp. 509-518.

Ohtomo et al., A high-mobility electron gas at the LaAlO$_3$/SrTiO$_3$ heterointerface, Nature, vol. 427, Jan. 29, 2004, pp. 423-426.

Park et al., "Quasi-single-crystal (001) SrTiO$_3$ templates on Si", Applied Physics Letters, vol. 95, (2009), 061902, http://dx.doi.org/10.1063/1.3202398, 3 pages.

Pojani et al., "A theoretical study of the unreconstructed polar (111) face of SrTiO$_3$", Applied Surface Science, vol. 142, (1999), pp. 177-181.

Sano et al., "Surface Energy Anisotropy of SrTiO$_3$ at 1400°C in Air", J. Am. Ceram. Soc., vol. 86, No. 11, (2003), pp. 1933-39.

Thompson C.V., "Grain Growth in Thin Films", Annu. Rev. Mater. Sci., vol. 20, (1990), pp. 245- 268.

Thompson C.V., "Secondary grain growth in thin films of semiconductors: Theoretical aspects", J. Appl. Phys., vol. 58, No. 2, Jul. 15, 1985, pp. 763-772.

Thompson et al., "Stress and Grain Growth in Thin Films", J. Mech. Phys. Solids, vol. 44, No. 5, (1996), pp. 657-673.

Vispute et al., "Heteroepitaxial structures of SrTiO$_3$/TiN on Si(100) by in situ pulsed laser deposition", J. Appl. Phys., vol. 80, No. 12, Dec. 15, 1996, pp. 6720-6724.

Yu et al., "The Chemical Bond and Atomic Displacements in SrTiO$_3$ From X-ray Diffraction Analysis", Acta Cryst., vol. B51, (1995), pp. 942-951.

Advances in Organometallic Chemistry, Ed. Stone and West, vol. 40, Academic Press (1996).

ALT, "Ethylkomplexe des Zirkonocens", J. of Organometallic Chemistry, vol. 391, 1990, pp. 53-60 and English translation.

Bedair, S.M., "Atomic Layer Epitaxy Deposition Processes," J. Vac. Sci Technol. B 12(1), Jan-Feb 1994, pp. 179-185.

Bilodeau et al., "MOCVD BaSrTiO$_3$ for ≥1-Gbit DRAMs," Solid State Technology, pp. 235-242 (Jul. 1997).

Blomberg et al., "Textured strontium titanate layers on platinum by atomic layer deposition", Thin Solid Films, vol. 520, 2012, pp. 6535-6540.

Bogorin et al. "LaAlO3/SrTiO3-Based Device Concepts", Department of Physics and Astronomy, University of Pittsburgh.

Guhl, Density functional theory study of oxygen and water adsorption on SrTiO$_3$(001), Dissertation, Mathematisch-Naturwissenschaftlichen-Fakultät, I Humboldt-Universität zu Berlin (2010).

Huang, et al. "Preparation of Characterization of Thin Films of MgO, Al$_2$O$_3$ and MgAl$_2$O$_4$ by Atomic Layer Deposition", Journal of Electronic Materials, vol. 22, No. 2 (1993).

Huang et al. "The surface morphology of atomic layer deposited magnesia", Journal of Materials Science Letters 12, pp. 1444-1446, Chapman & Hall (1993).

Huang et al., "Temperature-dependence of the growth orientation of atomic layer growth MgO", Appl. Phys. Lett. 61 (12); pp. 1450-1452 (Sep. 1992).

Iiskola, et al. "Functional surface groups for single-site heterogeneous α-olefin polymerization catalysts", Applied Surface Science 121/122 , pp. 373-377, Elsevier Science B.V. (1997).

Kang et al., "Deposition Characteristics of (Ba, Sr) TiO$_3$ Thin Films by Liquid Source Metal-Organic Chemical Vapor Deposition at Low Substrate Temperatures," Jpn. J. Appl. Phys., vol. 36, pp. 6946-6952 (1997).

Kiyotoshi et al., "Chemical Vapor Deposition of High Quality (Ba, Sr)TiO$_3$ Thin Films Using Individual Vaporizing Liquid Source Supply System," Electrochemical Society Proceedings, vol. 97-25, pp. 1063-1070 (1997).

Martensson et al., "Halide chemical vapour deposition of Bi$_2$Sr$_2$CaCu$_2$O$_{8-x}$: aspects of epitaxy," Journal of Crystal Growth, vol. 156, pp. 67-73 (1995).

Meevasana et al., "Creation and control of a two-dimensional electron liquid at the bare SrTiO3 surface", Nature Materials, vol. 10, Feb. 2011, pp. 114-118.

Nakano et al., "Digital Chemical Vapor Deposition of SiO$_2$," Appl. Phys. Lett. 57 (11), Sep. 10, 1990, pp. 1096-1098.

Niinistö et al., "Synthesis of oxide thin films and overlayers by atomic layer epitaxy for advanced applications," Materials Science & Engineering, vol. B41, pp. 23-29 (1996).

Niinisto et al., Structural and dielectric properties of thin ZrO2 films on silicon grown by atomic layer deposition from cyclopentadienyl precursor, J. of Applied Physics, vol. 95, No. 1, Jan. 1, 2004, p. 84.

Popovici et al., A comparative study of the microstructure-dielectric properties of crystalline SrTiO3 ALD films obtained via seed layer approach, Phys. Status Solidi A, vol. 208, No. 8, (2011), p. 1920-1924.

Putkonen, et al. "Enhanced growth rate in atomic layer epitaxy deposition of magnesium oxide thin films", Journal of Materials Chemistry, pp. 1857-1861, The Royal Society of Chemistry (2000).

Putkonen et al., Zirconia thin films by atomic layer epitaxy. A comparative study on the use of novel prepcursors with ozone, J. Mater. Chem., vol. 11, 2001, p. 3141-3147.

Ritala, et al. "Atomic Layer Deposition", Handbook of Thin Film Materials, vol. 1: Deposition and Processes of Thin Films, Chapter 2, pp. 103-159, Academic Press (2002).

Ritala et al., "Atomic Layer Epitaxy Growth of Titanium Dioxide Thin Films from Titanium Ethoxide," Chem. Mater., vol. 6, pp. 556-561 (1994).

Ritala et al., "Growth of titanium dioxide thin films by atomic layer epitaxy," Thin Solid Films, vol. 225, pp. 288-295 (1993).

Ritala et al., "Titanium is propoxide as a Precursor in Atomic Layer Epitaxy of Titanium Dioxide Thin Films," Chem. Mater., vol. 5, pp. 1174-1181 (1993).

(56) References Cited

OTHER PUBLICATIONS

Santander et al., "Two-dimensional electron gas with universal subbands at the surface of SrTiO3", Nature, vol. 469, Jan. 13, 2011, pp. 189-194.

Schulz et al., "MOCVD Routes to Thin Metal Oxide Films for Superconducting Electronics," Adv. Mater., vol. 6, No. 10, pp. 719-730 (1994).

Sheppard, "Advances in Processing of Ferroelectric Thin Films," Ceramic Bulletin, vol. 71, No. 1, (1992).

Suntola, "Atomic Layer Epitaxy," Thin Solid Films, vol. 216, pp. 84-89 (1992).

Suntola, "Atomic Layer Epitaxy", Handbook of Crystal Growth 3, Thin Films and Epitaxy, Part B: Growth Mechanisms and Dynamics, Chapter 14, pp. 601-663, Elsevier Science B. V. 1994.

Vehkamäki et al., "Growth of $SrTiO_3$ and $BaTiO_3$ Tin Films by Atomic Layer Deposition," Electrochemical and Solid-State Letters, 2 (10) pp. 504-506 (1999).

Wojtczak et al., "A Review of Group 2 (Ca, Sr, Ba) Metal-Organic Compounds as Precursors for Chemical Vapor Deposition," Advances in Organometallic Chemistry, vol. 40, pp. 215-340 Academic Press (1996).

Zubko et al, "Interface Physics in Complrx Oxide Heterostructures" Annu. Rev. Condens. Matter Phys., vol. 2, 2011, pp. 141-165.

\* cited by examiner

CRYSTALLINE STRONTIUM TITANATE AND METHODS OF FORMING THE SAME

CROSS-REFERENCE TO RELATED APPLICATIONS

This application claims priority to U.S. Provisional application No. 61/533,715, filed Sep. 12, 2011, U.S. Provisional application No. 61/562,888, filed Nov. 22, 2011, and U.S. Provisional application No. 61/647,638, filed May 16, 2012, the disclosures of which are incorporated herein by reference in their entirety.

BACKGROUND OF THE INVENTION

1. Field of the Invention

The application relates generally to strontium titanate (SrTiO$_3$), and more particularly to forming strontium titanate with large single crystal domains.

2. Description of the Related Art

Crystalline strontium titanate (SrTiO$_3$) is an interesting material as a building block for functional oxides with exotic properties, such as very high dielectric permittivities, very high electron mobility, superconductivity or colossal magnetoresistance, as well as piezoelectricity, pyroelectricity and ferroelectricity. Examples include Pb(Zr,Ti)O$_3$, (Ba,Sr)TiO$_3$, LiNbO$_3$, BaTiO$_3$, CaTiO$_3$, Sr$_{1-x}$La$_x$TiO$_3$, La$_{1-x}$Sr$_x$MnO$_3$, Nd$_{1-x}$Sr$_x$MnO$_3$, etc. SrTiO$_3$ is itself an interesting complex dielectric material in its own right, exhibiting quantum paraelectric insulation, ferroelectricitiy and superconductivity in various natural, strained and doped forms. Moreover, the cubic perovskite crystal structure of SrTiO$_3$ is compatible with, and can serve as a heterostructure template for many such exotic functional oxides, particularly those that take the form ABO$_3$ perovskites and related layer compounds.

However, SrTiO$_3$ is difficult to obtain in large substrates for forming functional oxides thereover. Typically SrTiO$_3$ wafers are only available up to 50 mm in diameter, limiting their usefulness for commercial scale production.

Accordingly, there is a need for methods of providing large scale SrTiO$_3$ crystals in commercially useful form.

SUMMARY OF THE INVENTION

Methods are provided for forming crystalline oxides. The methods generally include providing a substrate; depositing a strontium titanate layer on the substrate by atomic layer deposition; and subjecting the strontium titanate layer to a post-deposition anneal (PDA) under conditions selected to produce large single crystal domains in the strontium titanate layer. In some embodiments, a functional complex oxide is heterepitaxially deposited over the crystallized strontium titanate layer.

In another aspect, an apparatus comprising a thin film stack is disclosed, the apparatus comprising a crystal enhancement layer over a substrate and a strontium titanate film having a thickness over the crystal enhancement layer, wherein the strontium titanate film includes single crystal domains having lateral dimensions greater than the thickness of the strontium titanate film by a factor of at least two. In some embodiments the crystal enhancement layer comprises platinum. A heteroepitaxially deposited film of cubic perovskite complex oxide may be present over the strontium titanate film.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF EMBODIMENTS

Figure 1A:
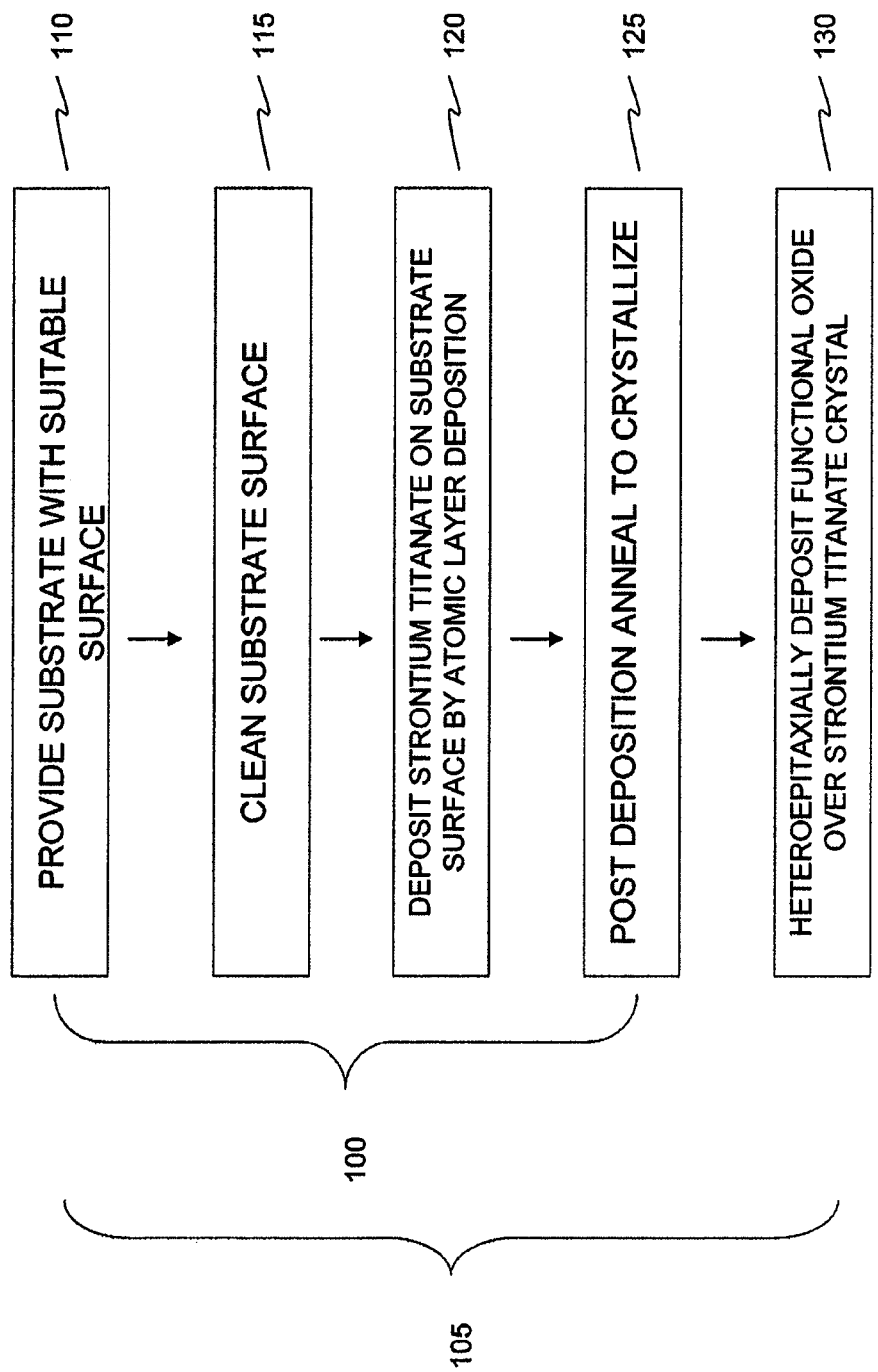
FIG. 1A is a flow chart illustrating a method of forming crystalline strontium titanate, and further employment thereof as a substrate for heteroepitaxy of functional oxides thereover, in accordance with an embodiment.

FIG. 1A illustrates a method of forming crystalline strontium titanate 100, as well as a method of forming functional oxides 105, in accordance with an embodiment. Because the strontium titanate disclosed herein is not necessarily stoichiometric SrTiO₃, and may be Sr-rich or Ti-rich, the abbreviation STO is employed herein to refer to strontium titanate.

The method of forming crystalline STO 100 includes providing 110 a substrate that has a surface suitable for forming perovskite oxides thereover. In particular, the surface should be largely inert with a weak bonding strength with STO such that during post-deposition anneal (PDA) the STO has sufficient mobility to reorder and form large scale single crystal domains. Preferably the bonding strength (surface atom or metal bond strength to oxygen, for example Pt—O bond strength) is less than about 150 kcal/mol, more preferably less than about 100 kcal/mol and most preferably less than about 90 kcal/mol. Surfaces having relatively weak bonding strengths, approximated to be about 90 kcal/mol or less, includes, but not limited to, Pt, Ag, Au, Bi, Co, Cu, F, Pd, Rh, Sb and Zn. However, the surface should have sufficient active sites or reactivity with oxygen that ALD growth is possible. Additionally, while the deposition of STO is not heteroepitaxial, in some embodiments the cell parameter of the substrate surface material is close to the lattice constant of the STO material to be deposited to encourage subsequent ordering of the STO during crystallization anneal. The surface can be provided by a layer formed over the substrate, which can be referred to as a crystal enhancement layer, serving both to initiate the ALD surface reactions and to allow relatively free growth of large single crystal domains during subsequent PDA.

Crystal enhancement layers on the substrate surface may include relatively inert metals such as antimony (Sb), palladium (Pd) and platinum (Pt). Other noble metals may also be suitable. In some cases crystal enhancement layers on the substrate surfaces include Pt, Ag, Au, Bi, Co, Cu, F, Pd, Rh, Sb and/or Zn. In some embodiments it is also desirable that the lateral coefficients of thermal expansion (CTE) of the substrate surface material and STO are similar, in order to prevent or reduce stress fractures of the crystalline STO during anneal and cool-down. SrTiO₃ has a CTE in the range of about $10 \times 10^{-6 \circ}$ C.$^{-1}$ to about $39 \times 10^{-6 \circ}$ C.$^{-1}$. However, matching CTE becomes less important if the bonding strength between the substrate surface and STO is very weak, or if the substrate is separated from the STO after crystallization (e.g., by etching away the substrate to form free-standing STO crystals or films).

Platinum's cell parameter is 3.923 Å, a very close match to strontium-rich STO, as described below, and Pt also has a suitable CTE, such that Pt is one preferred material for a crystal enhancement layer over which to deposit STO by ALD. In experimental examples described below, 200-mm semiconductor (silicon) substrates were provided each with an insulating layer in the form of silicon oxide (SiO₂), a titanium (Ti) layer thereover, and a platinum (Pt) layer thereover. For purposes of experimentation, the different layers were exposed by patterning, with the top Pt layer exposed in the middle of the substrate, SiO₂ exposed at the periphery, and Ti exposed in an intervening ring.

In some embodiments, the crystal enhancement layer is configured to anchor or seed crystallization in the subsequent PDA at controlled locations or periodicity. Such controlled crystal locations can aid device integration. For example, the crystal enhancement material (e.g., Pt) can be provided in the form of dots or islands across the substrate surface, e.g., by blanket Pt deposition, photolithography and etching, or other micolithographic techniques. A similar result can be achieved by use of self-assembled monolayers (SAMs) having periodic openings therein. For example, a blanket Pt layer can be formed, an SAM formed thereover with periodic openings exposing the underlying Pt, and selective ALD will selectively grow STO at the holes. Additionally, the substrate with the controlled crystal locations or periodicity can be transferred to a device substrate before or after crystallization anneal, e.g., using a SMARTCUT™ (Soitec) or similar delamination and transfer approach.

Next the substrate surface is cleaned 115. Cleaning in the experiments described below involved first loading the substrate into an atomic layer deposition (ALD) chamber, where the substrate was first exposed in situ to a pulse of ozone (O₃) to remove any organic surface contamination. Other oxygen sources can be employed alternatively or in combination with ozone, such as remotely or in situ generated oxygen plasma. Depending on how the crystal enhancement layer (e.g., Pt) layer surface is provided and how the substrate is stored/transported prior to the STO deposition, cleaning can be omitted. Routine experimentation can determine whether the crystal enhancement surface is clean enough to provide high quality, large scale crystalline STO.

Strontium titanate (STO) is then deposited 120 by ALD over the crystal enhancement layer surface, typically directly over and contacting the crystal enhancement layer. Exemplary ALD techniques for strontium titanate are disclosed, for example, in U.S. patent publication No. 2008-0072819 A1, the entirety of which is incorporated herein by reference. As described therein, ratios of ALD sub-cycles can be controlled in order to control the composition of multi-component oxides; in the present case, the ALD process can be modulated by choice of sub-cycle ratios to produce stoichiometric SrTiO₃, Sr-rich STO or Ti-rich STO. The composition of the STO can be selected to come close to matching the underlying crystal enhancement layer, to match the overlying complex functional oxide to be formed over the STO, or to introduce strain.

For example, a higher percentage of strontium for a strontium-rich strontium titanate can better match the lattice constant of the strontium titanate to the cell parameter of Pt (~3.920 Å), which is one preferred crystal enhancement material. Sr-rich strontium titanate contains >50 atomic % Sr/(Sr+Ti), and can be selected to be >55 atomic % Sr/(Sr+Ti). For example, Sr-rich strontium titanate with 60 atomic % Sr/(Sr+Ti) theoretically produces a lattice constant of 3.920-3.930 Å after crystallization anneal. In another example, if a smaller lattice constant is desired, the STO can be tuned to be titanium rich. For example, if the overlying functional oxide is to be LaAlO₃ (lattice constant 3.821 Å) it may be desirable to deposit Ti-rich STO on crystal enhancement material selected for this purpose. In still other examples, it may be desirable to tune the composition of the STO to have a smaller lattice constant than the overlying functional oxide, such that the overlying layer is compressively strained, or it may be desirable to tune the composition of the STO to have a larger lattice constant than the overlying functional oxide, such that the overlying layer is in tensile strain.

An example of an ALD sequence and suitable strontium, titanium and oxygen precursors are described below with respect to FIG. 1B.

Referring still to FIG. 1A, the deposited STO is then subjected to a post-deposition anneal (PDA) 125. Conditions are selected to produce large grain sizes, whereby the crystallized STO film includes individual single crystal grains whose lateral (parallel to the substrate surface) dimensions are larger by at least a factor of two (2) than the vertical thickness of the STO layer. Preferably the lateral dimensions of at least some grains are greater than the film thickness by at least a factor of five (5), and more preferably the average maximum lateral grain dimension exceeds the thickness by at least a factor of ten (10). Experiments show crystallized STO grains with lateral dimensions at least an order of magnitude greater than the film thickness. Moreover, lateral crystal growth was not limited by the morphology or atomic arrangement of the underlying Pt crystal enhancement layer.

Preferably annealing 125 is conducted between 350° C. and 800° C., preferably between about 500° C. and 600° C. For lower temperatures (<500° C.), longer anneal times can be used, such as between 1 minute and 24 hours. For higher temperatures (>600° C.), shorter anneal times can be used, such as between 1 second and 10 minutes or between 1 second and 60 seconds. The crystallization anneal 125 can be conducted in any suitable atmosphere, including $N_2$, $H_2$, forming gas, $O_2$, air, inert gas (e.g., Ar, He), and mixtures of the above. Preferably the annealing environment includes oxygen.

In the experiments described below, annealing was performed at 600° C. for 60 minutes in air. A gradual cool down (as opposed to active cooling), e.g., over greater than 2 hours in the anneal furnace, may be used to reduce or prevent undue stress formation in the layer stack.

In another embodiment, the STO film can be locally crystallized in a desired pattern. For example, excimer laser or infrared laser energy can be applied selectively in a desired pattern to leave a pattern of active material in the form of single crystalline STO embedded within amorphous STO, which is a very good insulator. Such patterned crystallization, in addition to or in place of patterned template or crystal enhancement layer, can aid in device integration of either STO or functional oxides formed thereover.

As illustrated by the Examples below, the methods of forming crystalline strontium titanate described herein have been shown to produce surprisingly large single crystal domains on the substrate. Such crystalline layers can be useful for further heteroepitaxial deposition 130 of functional oxides, particularly perovskite oxides of the form $ABO_3$, such as superconductive oxides, ferroelectric oxides, or oxides with colossal magnetoresistance. The functional oxides may be heteroepitaxially deposited directly over and contacting the annealed strontium titanate layer.

The skilled artisan will appreciate that the method of forming crystalline strontium titanate 110 can be provided independently from any subsequent heteroepitaxy 130 thereover. Alternatively, the same manufacturer can conduct the entirety of the method of forming functional oxide 105.

Figure 1B:
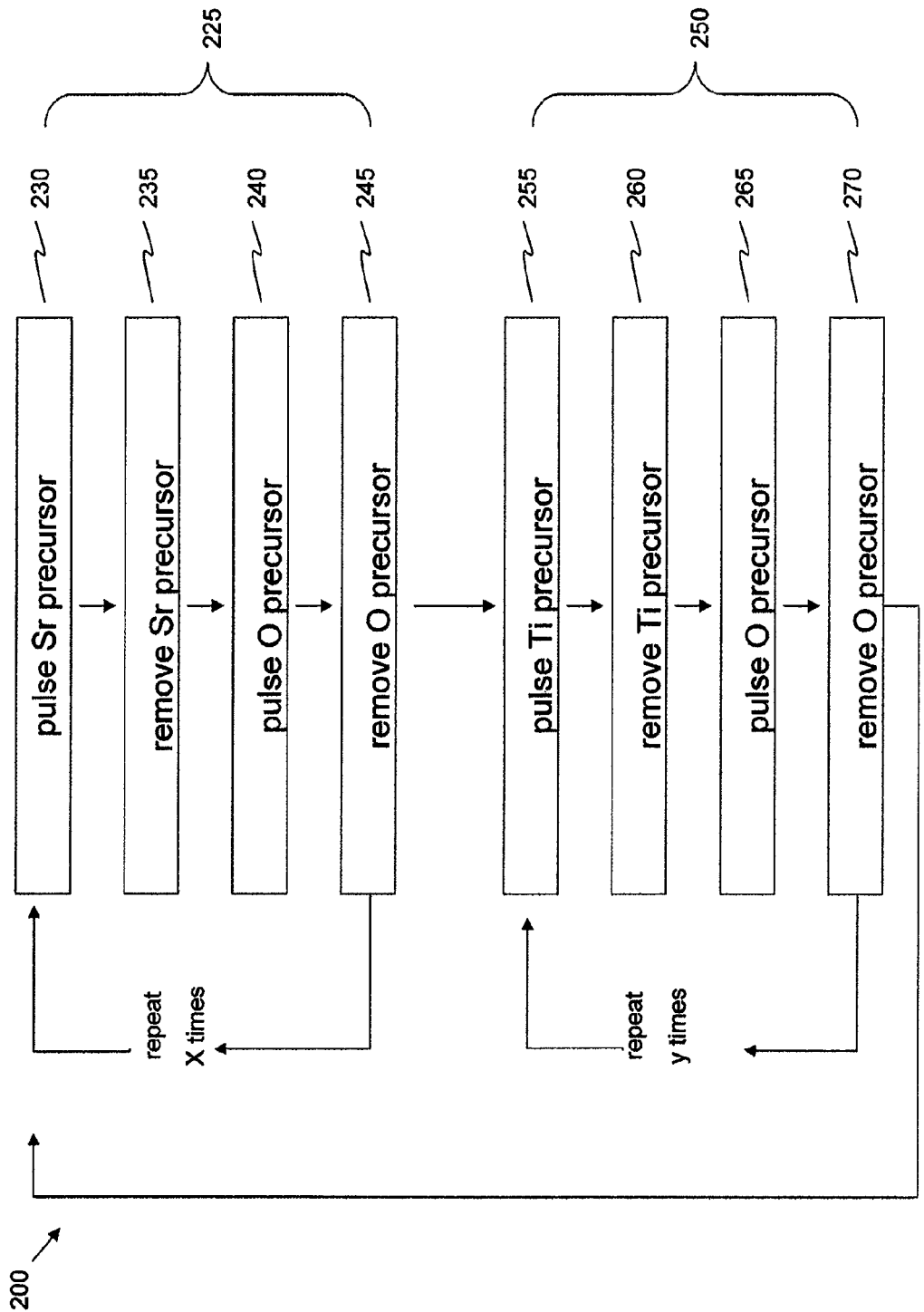
FIG. 1B is a flow chart illustrating a method of atomic layer deposition (ALD) for forming strontium titanate in accordance with an embodiment.

FIG. 1B illustrates an atomic layer deposition method useful for providing strontium titanate. The process represents a supercycle 200 for forming strontium titanate, including a strontium oxide subcycle 225 and a titanium oxide subcycle 250. The ratio of strontium oxide subcycles 225 to titanium oxide subcycles 250 in the overall process (x/y) is chosen for the desired stoichiometry, which can be readily determined by routine experimentation in view of the present disclosure, and may differ for a given stoichiometry with different precursors or deposition conditions. As noted above, a Sr-rich STO can be formed in general by increasing the ratio of x/y when a larger lattice constant is desired (e.g., to better match the underlying crystal enhancement layer, to better match the overlying functional oxide, and/or to introduce strain in the overlying functional oxide). On the other hand, a Ti-rich STO can be formed in general by decreasing the ratio of x/y when a smaller lattice constant is desired for the same reasons.

For example, a ratio x/y of 2.0 (two strontium oxide subcycles to one titanium oxide subcycle) produces a Sr rich STO film with about 60 atomic % Sr/(Sr/Ti), using $Sr(t-Bu_3Cp)_2$+ $O_3$ for the strontium oxide subcycles 225 and $Ti(OMe)_4+O_3$ for the titanium oxide subcycles 250. The skilled artisan will appreciate that the actual sequence among the subcycles is not as important as the overall ratio within the supercycle 200, such that the a ratio of x/y of 2.0 can be accomplished by alternating 2 SrO subcycles 225 with 1 $TiO_2$ subcycle 250; alternating 4 SrO subcycles 225 with 2 $TiO_2$ subcycles 250; providing 3 SrO subcycles 225 followed by 1 $TiO_2$ subcycle 250 followed by 1 SrO subcycle 225 followed by 1 $TiO_2$ subcycle 250; etc. Similarly, each supercycle 200 need not have identical sequences as long as the overall ratio provides the desired stoichiometry.

Figure 1C:
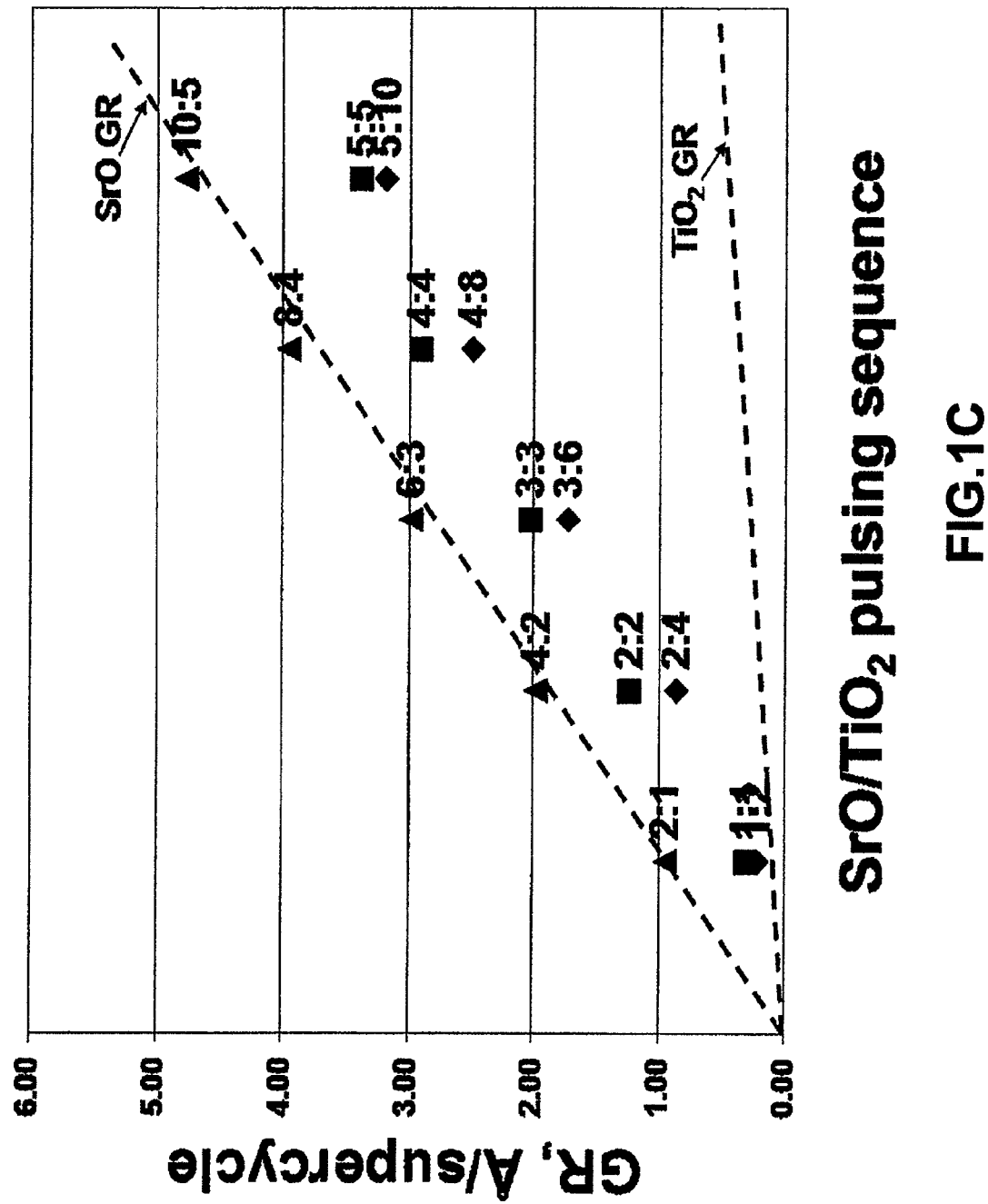
FIG. 1C and 1D are graphs plotting growth rate per supercycle for different pulsing ratios and number and ratios of SrO and TiO subcycles per supercycle. Depositions were started with the SrO step. Substrates were bare silicon wafers with native oxide.
Figure 1D:
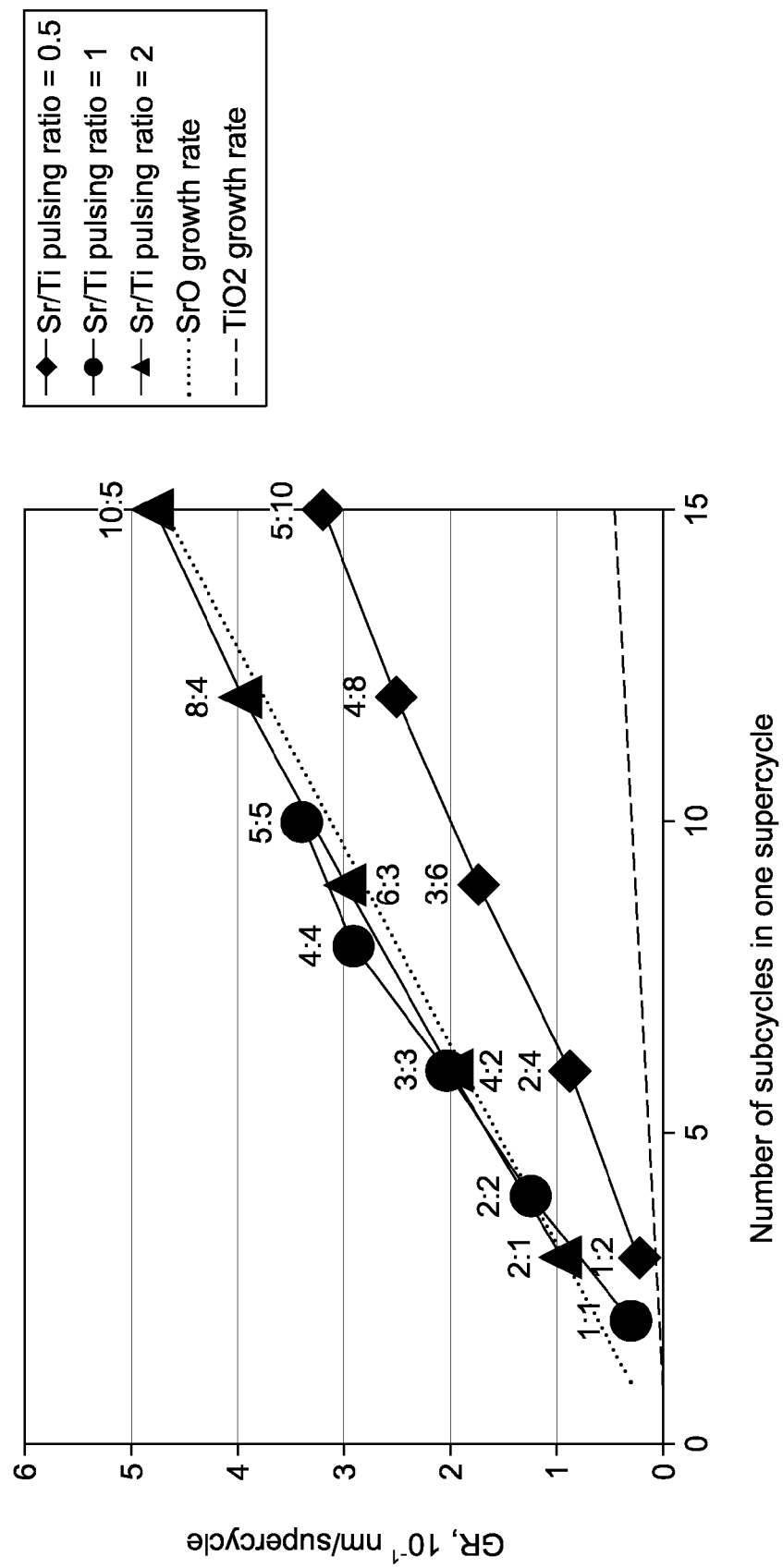
Figure 1E:
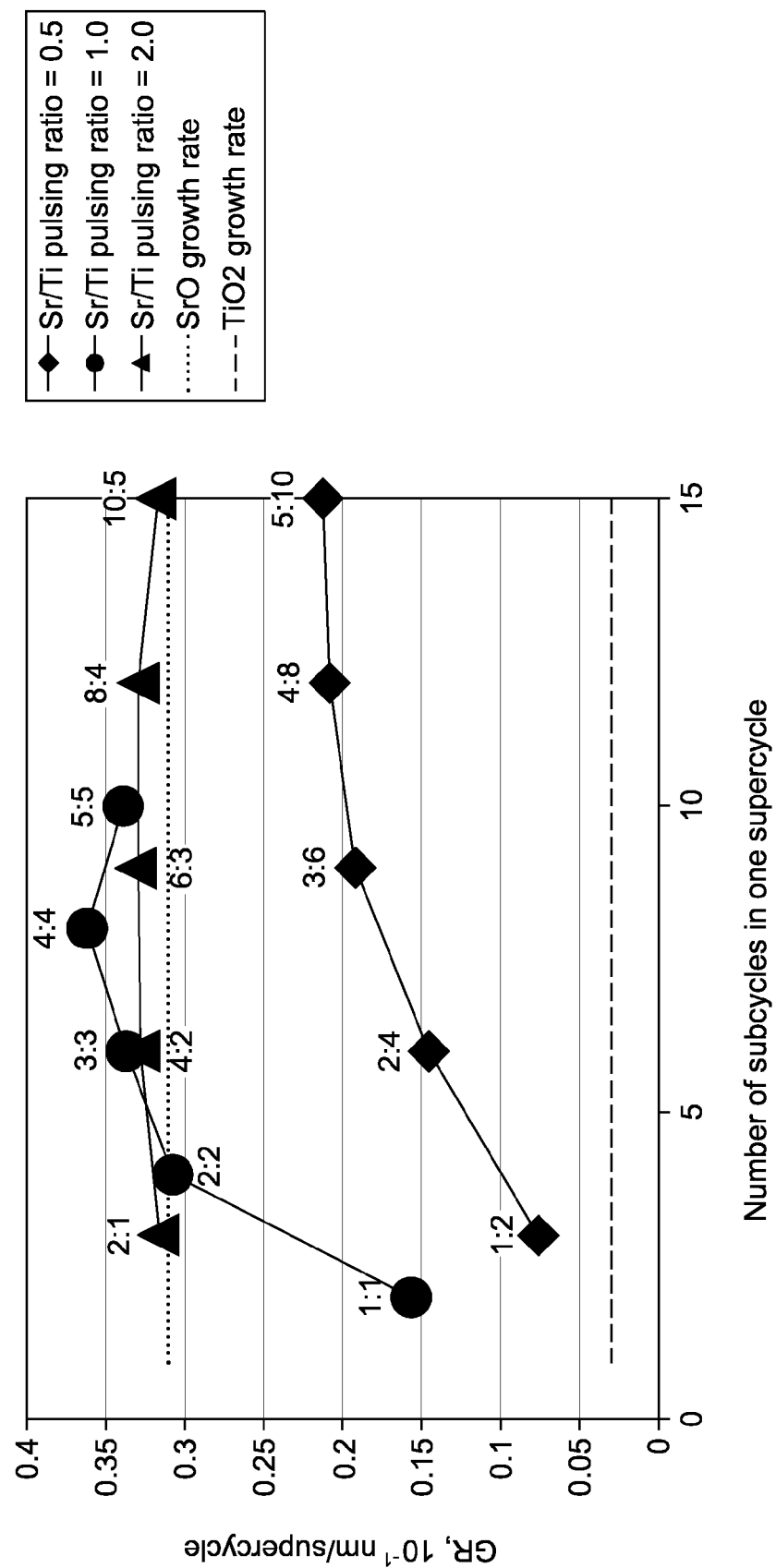
FIG. 1E is a graph plotting growth rate per subcycle for different pulsing ratios and number and ratios of SrO and TiO subcycles per supercycle. Depositions were started with the SrO step. Substrates were bare silicon wafers with native oxide.
Figure 1F:
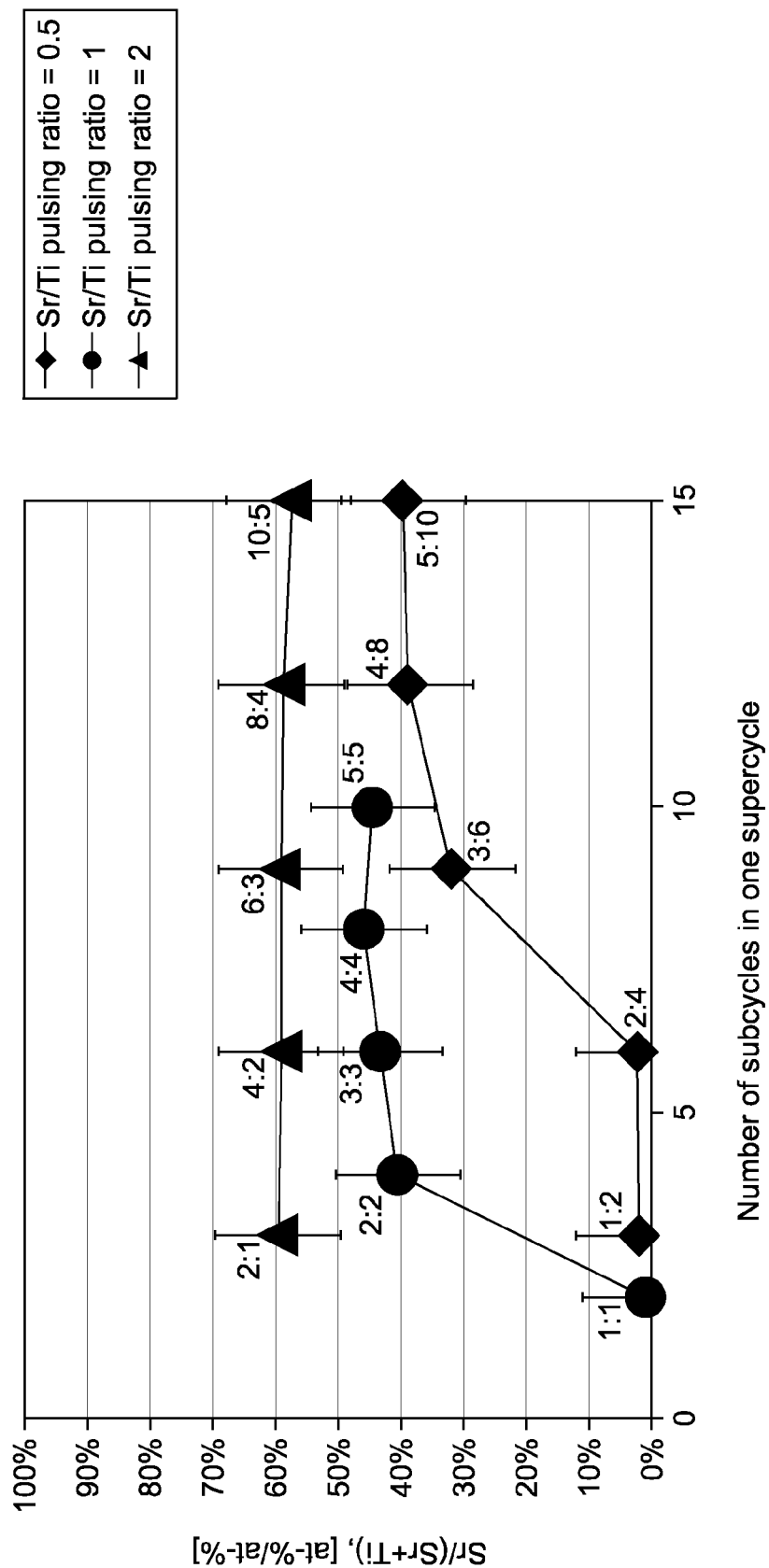
FIG. 1F illustrates the compositions of ALD STO films with different pulsing sequences.

FIGS. 1C and D illustrate growth rates per supercycle for supercycles of various ratios and numbers of SrO and $TiO_2$ subcycles. FIG. 1E illustrates growth rates per subcycle for supercycles of various ratios and numbers of SrO and $TiO_2$ or $TiO_x$ subcycles. FIG. 1F illustrates the compositions of ALD STO films with different pulsing sequences. Depositions were started with a SrO step and substrates were bare silicon wafers with native oxide. The ALD growth rates of the SrO and $TiO_2$ binary steps showed differences depending on the composition of the starting surface. On Ti rich surfaces, the growth rates are low compared to the Sr rich surfaces. Sr-rich deposition can increase deposition rates, as it is believed that hydroxylation increases with higher Sr content, compared to Ti. Accordingly, aside from ratio, pulsing sequence can also affect deposition rates.

Strontium Precursors

Suitable strontium precursors include cyclopentadienyl (Cp) precursors of the form:

$$Sr(Cp)_2 \hspace{2cm} (I)$$

$$Sr(Cp)_2L_n \hspace{2cm} (II)$$

$$Sr(Cp)X \hspace{2cm} (III)$$

$$Sr(Cp)XL_n \hspace{2cm} (IV),$$

in which formulae:

Cp is a cyclopentadienyl group, the Cp groups present in Formulae I and II being mutually the same or different;

X is a ligand other than Cp, with the valency of −1;

Ln is a neutral adduct ligand which binds to a metal by either one or several of its atoms, and n depicts the number of the ligands being bound.

In Formulae I-IV the cyclopentadienyl groups may also be in the same molecule. In this case the bridge between two Cp groups is made up of a substituted or unsubstituted C1-C6 chain, which may contain a heteroatom which is Si, N, P, Se or S.

For Formulae III or IV, ligand X is preferably β-diketonate or a corresponding sulfur or nitrogen compound, halide, amide, alkoxide, carboxylate or Schiff base.

L is preferably
(i) a hydrocarbon,
(ii) an oxygen-containing hydrocarbon,
(iii) a nitrogen-containing hydrocarbon,
(iv) a sulfur-containing hydrocarbon,
(v) a phosphorus-containing hydrocarbon,
(vi) an arsenic-containing hydrocarbon,
(vii) a selenium-containing hydrocarbon, and/or
(viii) a tellurium-containing hydrocarbon.

Most preferably L is
(a) an amine or a polyamine,
(b) a bipyridine,
(c) a ligand depicted by the formula

(V)

in which formula G is —O—, —S—, or —NR¹—, where $R^1$ is hydrogen or a substituted or unsubstituted, cyclic, linear or branched alkyl, alkenyl, aryl, alkylaryl, arylalkyl, alkoxy, thio, cyano or silyl group. The cyclic or aromatic ring of $R^1$ may contain a heteroatom. The ligand depicted by Formula V may also have either hydrogen or a substituent like $R^1$ attached to the carbon atoms, (d) ether or thioether.

The cyclopentadienyl group (Cp) in Formulae I-IV is of the form $$Cp'R_mH_{5-m} \qquad (VI),$$

where m is an integer of 0-5,
Cp' is a fused or individual cyclopentadienyl, and
R is a hydrocarbon radical containing 1-20 carbon atoms, preferably a $C_1$-$C_6$ hydrocarbon. The R's may be mutually the same or different. R may be a substituted or unsubstituted, cyclic, linear or branched alkyl, alkenyl, aryl, alkylaryl, arylalkyl, alkoxy, thio, amino, cyano or silyl group. The cyclic or aromatic ring of the substituent may contain a heteroatom. Methyl, ethyl, propyl and isopropyl groups can be mentioned as examples of the substituents.

An organometallic complex according to Formula II can have Cp as a cyclopentadienyl, indenyl or fluorenyl. Examples of the neutral adduct ligand L (Formulae II and IV) include, for example, ethers, amines or solvent molecules (e.g. tetrahydrofuran) which bind to the metal by one atom. Polyethers and polyamines can be mentioned as examples of suitable ligands which bind to the metal by several of their atoms. In a particular example, the strontium precursor is a THF adduct of bis(pentamethylcyclopentadienyl) or bis(tri-isopropylcyclopentadienyl).

The Sr precursor can also be a betadiketonate compound, such as Sr(tdh)2 and Sr(acac)2.

Experiments described below used $Sr(t-Bu_3Cp)_2$ as the strontium precursor from a source vessel kept at 165° C. $Sr(t-Bu_3Cp)_2$ represents a compound of Formula IV (Sr $(Cp'R_mH_{5-m})XL_n$), in which R is tertbutyl and m is 3. In general, compounds of Formula IV provide very suitable compounds for ALD of STO.

Titanium Precursors

Examples of volatile titanium compounds suitable for use in ALD of strontium titanate include:

titanium halides, for example $TiCl_4$, $TiBr_4$, $TiI_4$, titanium alkoxides, for example $Ti(OC_2H_5)_4$, $Ti(O^iPr)_4$, $Ti(O^nBu)_4$ and titanium(IV)-ethylhexoxide, titanium nitrate $(Ti(NO_3)_4)$, alkylamino complexes of titanium, for example tetrakis (diethylamino)titanium, tetrakis(dimethylamino)titanium, tetrakis(ethyl-methylamino)titanium, tetrakis(isopropylmethylamino)titanium, bis(cyclo-pentadienyl)bis(dimethylamino)titanium, tris(dimethylamino)(N,N,N'-tri-methylethyldiamino)titanium, and tert-butyltris(dimethylamino) titanium; further examples of applicable compounds are described in U.S. Pat. No. 5,659,057, cyclopentadienyl complexes of titanium, for example $Ti(\eta^5-C_5H_5)_2$, $Ti(\eta^5-C_5H_5)(\eta^7-C_7H_7)$, $(\eta^5-C_5H_5)TiR_2$, where R=alkyl (e.g. $CH_3$), benzyl ($C_6H_5$) or carbonyl, bis(t-butylcyclopentadienyl)titanium dichloride, bis(pentamethylcyclopentadienyl)titanium dichloride, and $(C_5H_5)_2Ti(CO)_2$, silylamido complexes of titanium, such as $Ti\{N_4[Si(CH_3)_3]_4[Si(CH_3)_2]_2\}$; further examples of applicable compounds are described in U.S. Pat. No. 5,603,988, titaniumdialkyldithiocarbamates, and titanium-β-diketonates, for example di(i-propoxide)bis(2,2,6,6-tetramethyl-3,5-heptanedionato)titanium, and tris(2,2,6,6,-tetramethyl-3,5-heptanedionato)-titanium(III).

In some embodiments the Ti precursor is titanium tetraisopropoxide $(Ti(O^iC_3H_7)_4)$.

Experiments described below employed $Ti(OMe)_4$ as the titanium precursor.

Oxygen Precursors

The oxygen precursor may be any oxygen compound usable in ALD techniques. Preferred oxygen precursors include water, oxygen and hydrogen peroxide, and aqueous solutions of hydrogen peroxide. Ozone ($O_3$) is particularly preferred for depositing denser oxides and higher quality crystallinity after anneal.

One or more of the following compounds may also be used as the precursor for oxygen:

oxides of nitrogen, such as $N_2O$, NO, and $NO_2$, halide-oxygen compounds, for example chlorine dioxide ($ClO_2$) and perchloric acid ($HClO_4$), the compatibility of these with earth-alkali metals being, however, limited, peracids (—O—O—H), for example perbenzoic acid ($C_6H_5COOOH$) and peracetic acid ($CH_3COOOH$), alcohols, such as methanol ($CH_3OH$) and ethanol ($CH_3CH_2OH$), and oxygen atoms and excited species, such as oxygen radicals, oxygen-containing plasma and hydroxyl radicals (*OH).

Thin Film Structures

As noted above, the methods described herein can be used to produce thin film stacks including an STO film over a crystal enhancement layer, typically directly over, where the crystal enhancement layer has the desired crystal orientation for the STO film and a lattice constant close enough to STO that it can be closely matched by modulating relative Sr and Ti content in the STO film. In one example, Sr-rich STO, preferably >55 at. % Sr, and more preferably about 60 at. % Sr, has a cell parameter of about 3.920 Å to 3.930 Å, closely matching the cell parameter for Pt of 3.923 Å. The crystal enhancement layer, which can be continuous or discontinuous, overlies a semiconductor substrate, such as a silicon wafer, with or without intervening layers. Examples of suitable crystal enhancement layers include relatively inert metals such as antimony (Sb), palladium (Pd) and platinum (Pt).

In some embodiments the STO includes individual single crystal grains whose lateral (parallel to the substrate surface) dimensions are larger by at least a factor of two (2) than the vertical thickness of the STO layer. Preferably the lateral dimensions of at least some grains are greater than the film thickness by at least a factor of five (5), and more preferably the average maximum lateral grain dimension exceeds the thickness by at least a factor of ten (10). Experiments show crystallized STO grains with lateral dimensions more than an order of magnitude greater than the film thickness. For example, crystallized STO with a thickness of less than 100 nm, particularly about 60 nm, included single crystal domains or crystallites between 0.2 µm and 1.0 µm in width.

In some embodiments, the orientation of the crystallized STO thin film matches the orientation of the underlying crystal enhancement layer. For example (111) oriented platinum may underly (111) oriented STO. However, in some embodiments following post deposition anneal most of the STO grains show a preferential orientation of (001). Neither the morphology nor atomic arrangement of the underlying crystal enhancement layer necessarily matches the overlying crystallized STO film. For example, the crystallized STO film can be smooth, with a roughness less than 2.0 nm rms, and more smooth than the interface between the STO and the crystal enhancement layer, and the crystal boundaries in the STO film do not mirror the grain boundaries of the crystal enhancement layer.

In some embodiments the thin film stack can further include heteroepitaxial complex oxides over, preferably directly over, the STO film, such as perovskite oxides of the form $ABO_3$, for example, $LaAlO_3$. These may be, for example, superconductive oxides, ferroelectric oxides, or oxides with colossal magnetoresistance.

Device Integration

As noted above, after formation of STO with large single crystal domains, the STO can be employed as a template for further formation of functional oxides over the crystalline strontium titanate, particularly perovskite oxides of the form $ABO_3$, such as superconductive oxides, ferroelectric oxides, or oxides with colossal magnetoresistance.

Figure 14:
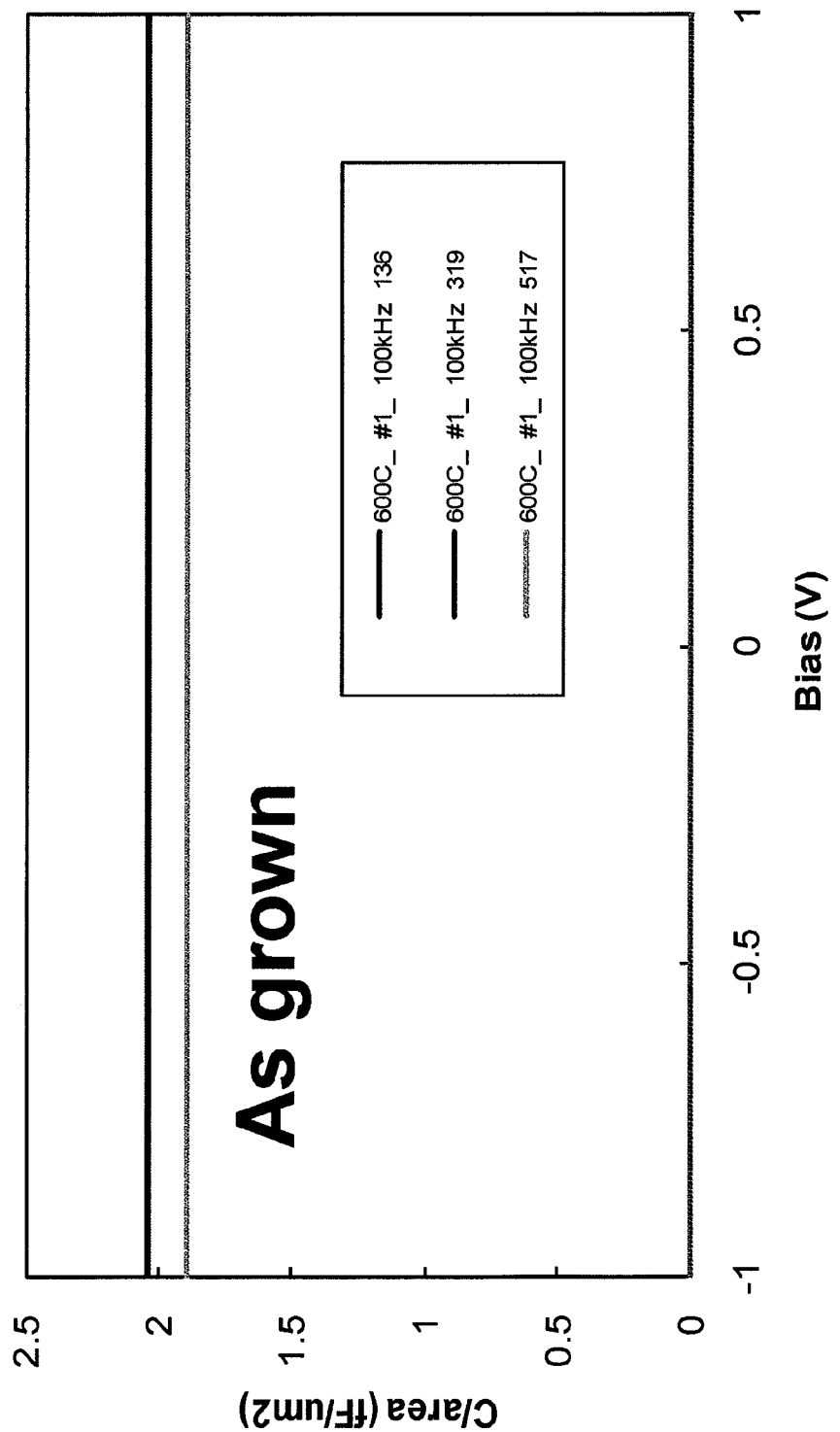
FIGS. 14-15 are graphs plotting capacitance per unit area as a function of bias voltage using strontium titanate films, formed as described herein, between two electrodes.
Figure 15:
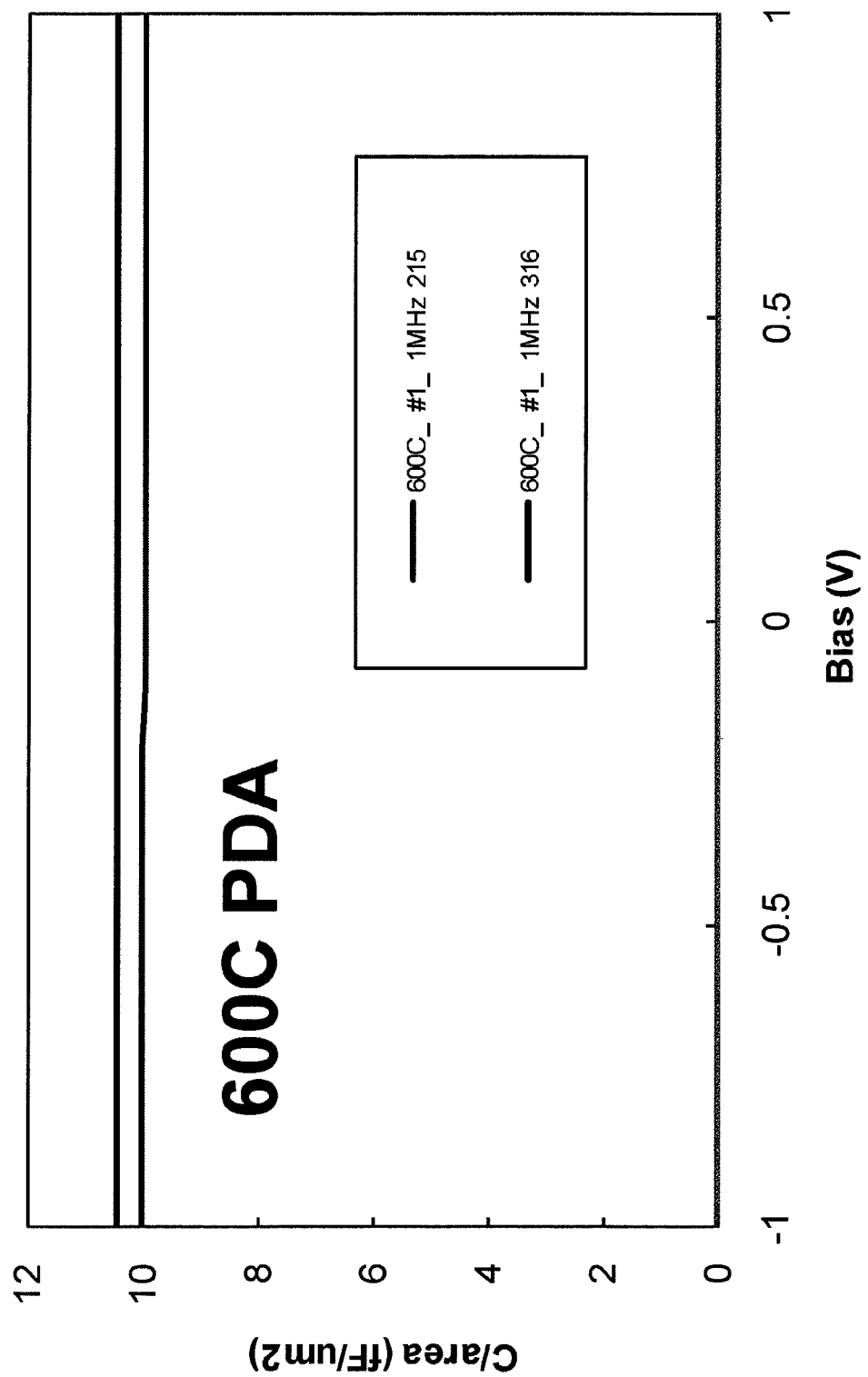
Figure 16:
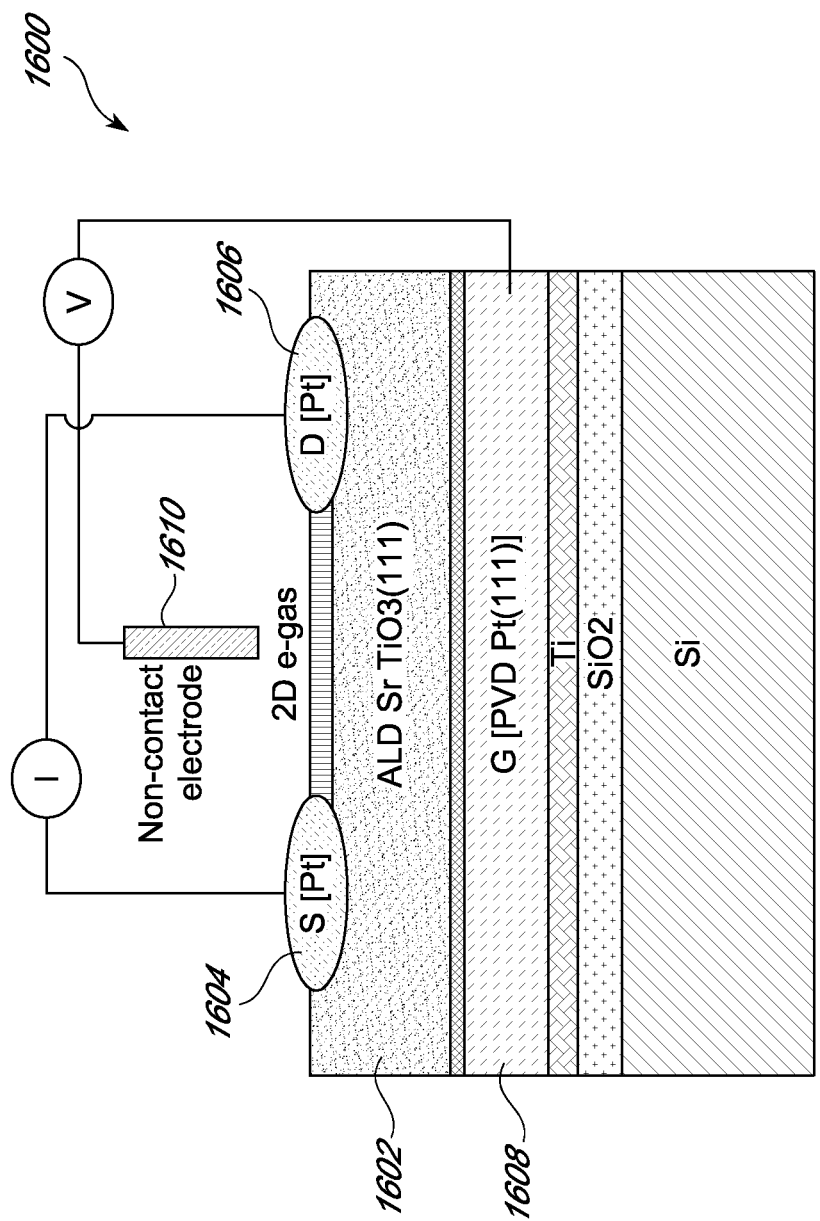
FIG. 16 is a transistor structure employing a crystalline strontium titanate film over a metal layer.

Additionally, it will be apparent to the skilled artisan that the above described process will be beneficial for other applications in which large single crystal domain strontium oxide is desired, as illustrated by FIGS. 14-16.

FIGS. 14-15 illustrate capacitance per unit area against bias voltage for STO films deposited as described above and in the examples below. FIG. 14 employs an as-deposited film, whereas FIG. 15 employs a post-depositional annealed film. Good area scaling suggests that the film is electrically uniform laterally across the film. Very flat capacitance-voltage curves at high frequency indicate small dissipation factors, such that the methods and crystalline STO films described herein can be employed in high quality capacitors.

FIG. 16 illustrates one example of a transistor structure 1600 employing STO as described herein. In this case, STO itself is employed within the electronic device, without any overlying functional oxide. The STO serves as a two-dimensional electron gas (2DEG) channel 1602 in an analog device. A source 1604 and a drain 1606 on the STO channel 1602 are illustrated as being formed by platinum contacts, but other conductive materials can serve as contacts. A gate layer 1608 underlying the channel 1602 can be a platinum layer upon which the STO is deposited by ALD in the methods described above, although other metals can also serve in other embodiments. A non-contact electrode 1610 is shown over the channel 1602, between the source 1604 and drain 1606.

When a voltage difference is introduced between the source 1604 and drain 1606, some current can flow in the absence of a potential difference between the gate 1608 and the non-contact electrode 1610. The current flow depends upon the natural conductivity of the channel, which depends in turn upon the contamination levels in the STO, adsorption of molecules on the channel surface, oxygen vacancies in the STO, etc. Application of a potential difference between the gate 1608 and the non-contact electrode 1610 can increase or decrease the concentration of carriers (electrodes or holes) in the channel 1602, thus increasing or decreasing conductivity of the channel 1602, depending upon the polarity of the applied voltage. Accordingly, for a given bias voltage across the source 1604 and drain 1606, modulating the voltage difference between the gate 1608 and the non-contact electrode 1610 can modulate the current flow between source 1604 and drain 1606.

EXAMPLES

Strontium titanate films were deposited by ALD in a Pulsar® 2000 R&D reactor. The reactor was modified from the standard design with two convection oven-based heating sources to enable the heating of the Sr and Ti precursors used. $Sr(t-Bu_3Cp)_2$ and $Ti(OMe)_4$ were used as metal precursors and $O_3$ as the oxygen source. The strontium source was at 165° C. and the Ti source was at 155° C. The ozone concentration used was 200 g/Nm³ and the reactor temperature was 250° C. See Blomberg et al. *Thin Solid Films*, Volume 520, Issue 21, 31 Aug. 2012, Pages 6535-6540, the disclosure of which is incorporated herein by reference in its entirety.

Figure 2:
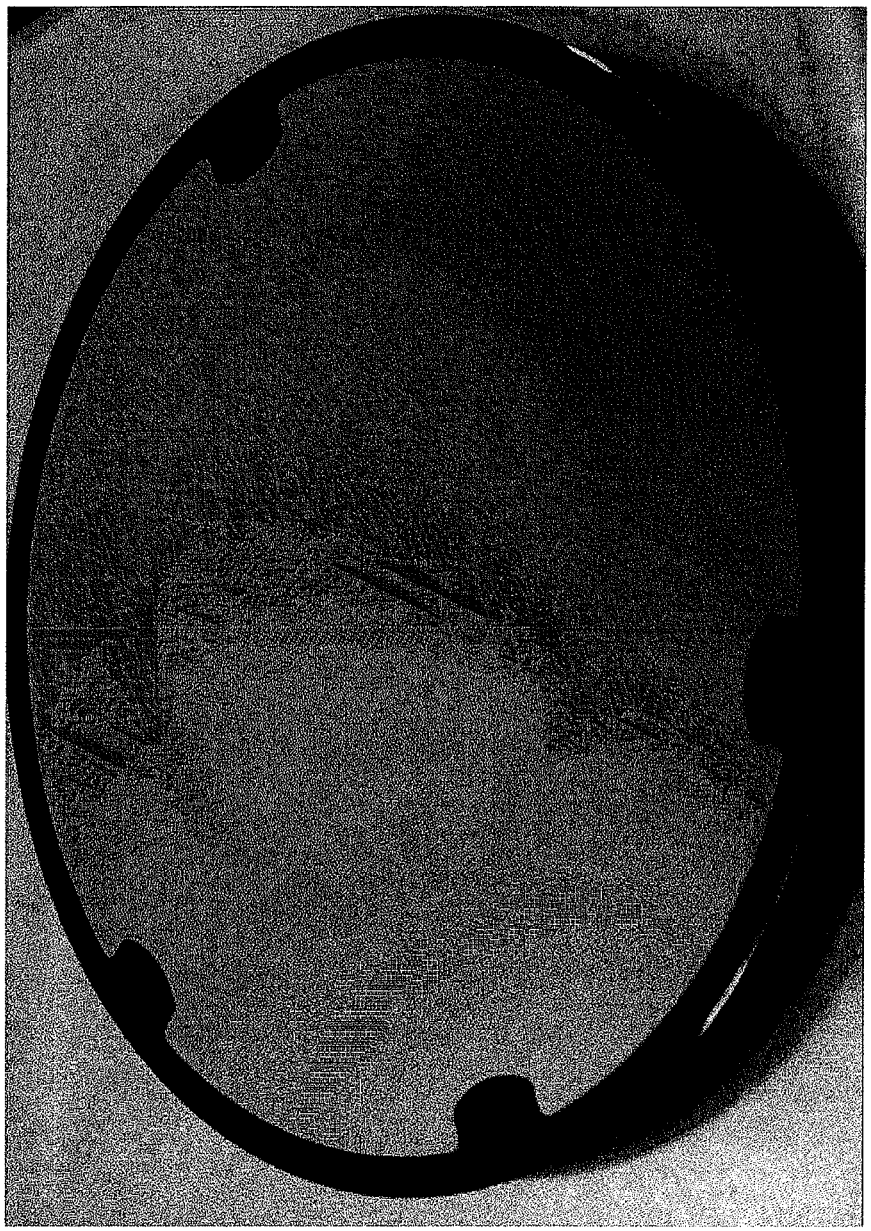
FIG. 2 is a photograph of a wafer with strontium titanate deposited by ALD over three different exposed substrate materials (SiO$_2$, Ti and Pt).

Films were deposited on Ø200 mm Pt/Ti/SiO₂/Si wafers with ~80 nm Pt, ~10 nm Ti and ~20 nm thick $SiO_2$ layers. FIG. 2 is a photograph of an exemplary substrate after STO deposition. The thicknesses and compositions of the films were estimated with spectroscopic ellipsometry (Sentech SE800). The ellipsometric model was first calibrated with XRR (Brüker D8 Advance) for thickness and with RBS for composition (University of Jyväskylä, Department of Physics, calibration samples ranging from 35-61% Sr/(Sr+Ti)). Then the refractive indices (RI) of the films were used to estimate the compositions of the films. However, large changes in film composition can result in small changes in the RI. Therefore, ±10%-point errors were estimated for the composition analysis as shown in FIG. 1F.

A $SrO/TiO_2$ pulsing sequence of 2:1 resulted in strontium content of ~60 at-% Sr/(Sr+Ti). The deposition process was started with a 60 s $O_3$ pulse to remove possible organic surface contamination on the platinum surface. STO film deposition was started with the SrO step. The strontium rich composition was chosen in order to minimize the lattice mismatch between the cubic STO and cubic Pt. Sr rich composition increases the unit cell size of STO. The composition was expected to give a cell parameter of 3.920-3.930 Å for STO after crystallization anneal, a very close match for the cell parameter of Pt, 3.923 Å.

After film depositions, 80 mm×120 mm sized samples were cut from the STO/Pt/Ti/SiO₂/Si and Pt/Ti/SiO₂/Si wafers and annealed at 600° C. in air in a laboratory furnace (Nabertherm N3R) for 60 min and then cooled down slowly. The slow cool down was accomplished by turning off the oven at 600° C. and letting it cool by itself for approximately three hours with the samples still inside. After three hours the oven temperature had fallen below 200° C. and the samples were removed from the oven.

The films were analyzed with x-ray diffraction (XRD) using Rigaku DMAX 1500 with CuKα radiation, with x-ray reflection (XRR) using Brüker D8 Advance, with transmission electron microscopy (TEM) and electron diffraction (ED) using JEOL 2010 operated at 200 kV and equipped with high resolution pole piece (analysis done by EAG Labs, Sunnyvale, Calif.) and with electron backscatter diffraction (EBSD) analysis using Zeiss Ultra 55 field emission gun secondary electron microscope equipped with Nordlys F+ camera and Channel 5 software from Oxford Instruments.

The growth characteristics of the STO ALD process when carried out on native silicon oxide is presented in FIGS. 1C-1F. Strontium titanate was deposited with the supercycle method: $z.\{x.\ [(Sr(t-Bu_3Cp)_2+O_3)]+y.[(Ti(OMe)_4+O_3)]\}$, where z=number of supercycles used to control the film thickness, x=number of SrO subcycles in one supercycle and y=number $TiO_2$ subcycles in one supercycle. The ALD growth rates of the SrO and $TiO_2$ binary steps show differences depending on the composition of the starting surface. On a Ti-rich surface the growth rates are very low compared to the Sr-rich surface. Therefore, the growth per one STO cycle and film composition reflects the pulsing ratio (x/y) as well as the particular pulsing sequence used. The growth rate of both SrO and $TiO_2$ binary steps are low on a Ti-rich surface, whereas when Sr is present on the surface, the binary growth rates of both SrO and $TiO_2$ steps reach a growth per cycle similar to pure SrO growth. This can be understood in terms of the differences in the number of surface hydroxyl groups on the STO depending on its surface termination. Sr-rich termination leads to a higher number of surface hydroxyl groups than a Ti-rich surface with a given $H_2O$ partial pressure (some $H_2O$ is formed when the ligands of the adsorbed precursor molecules react with $O_3$). Although the STO being deposited is amorphous and its surface termination thermodynamics are not known, it is assumed to behave similarly to crystalline STO.

Figure 3:
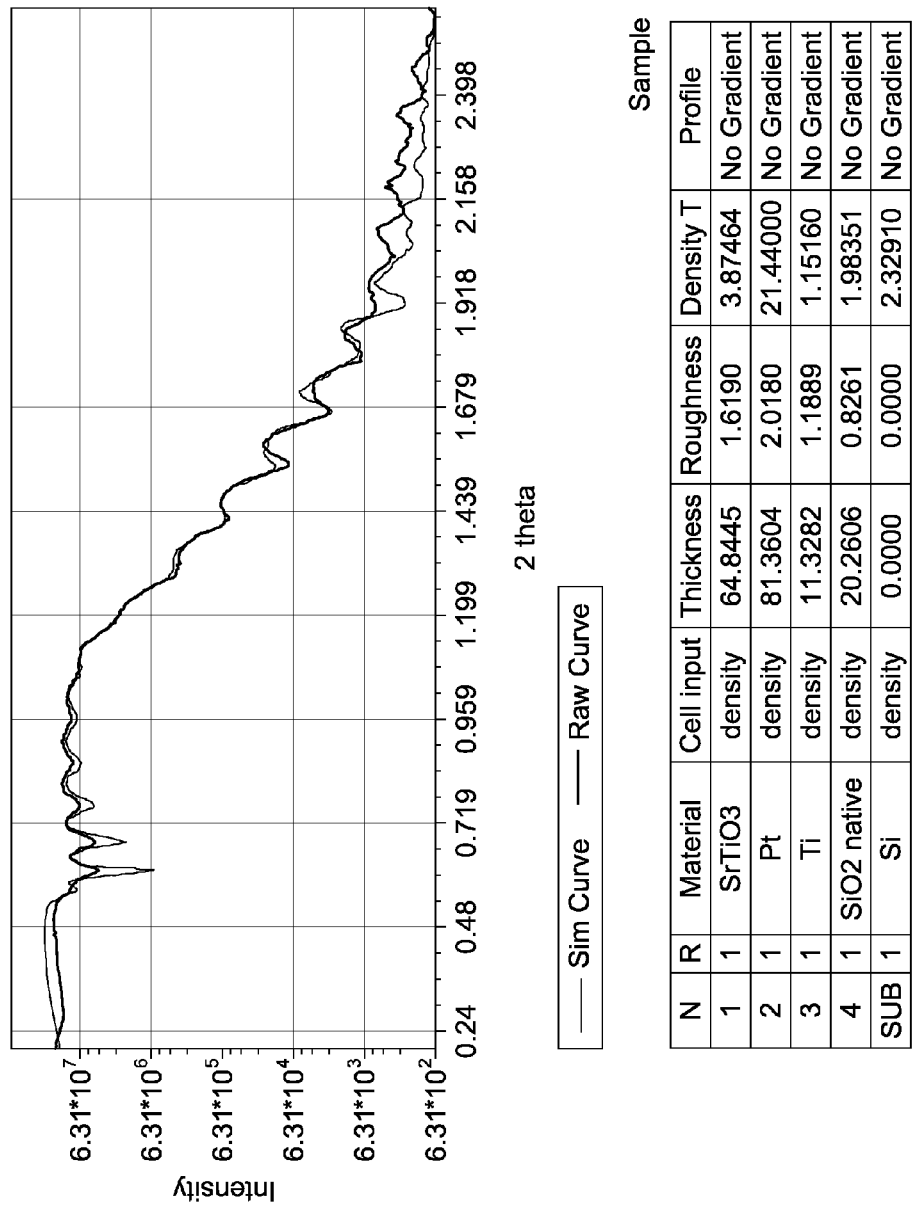
FIG. 3 provides XRR patterns of an as deposited STO/Pt/Ti/SiO$_2$/Si stack. Thickness and roughness values are in nanometers and film density in grams per cubic centimeter.
Figure 4:
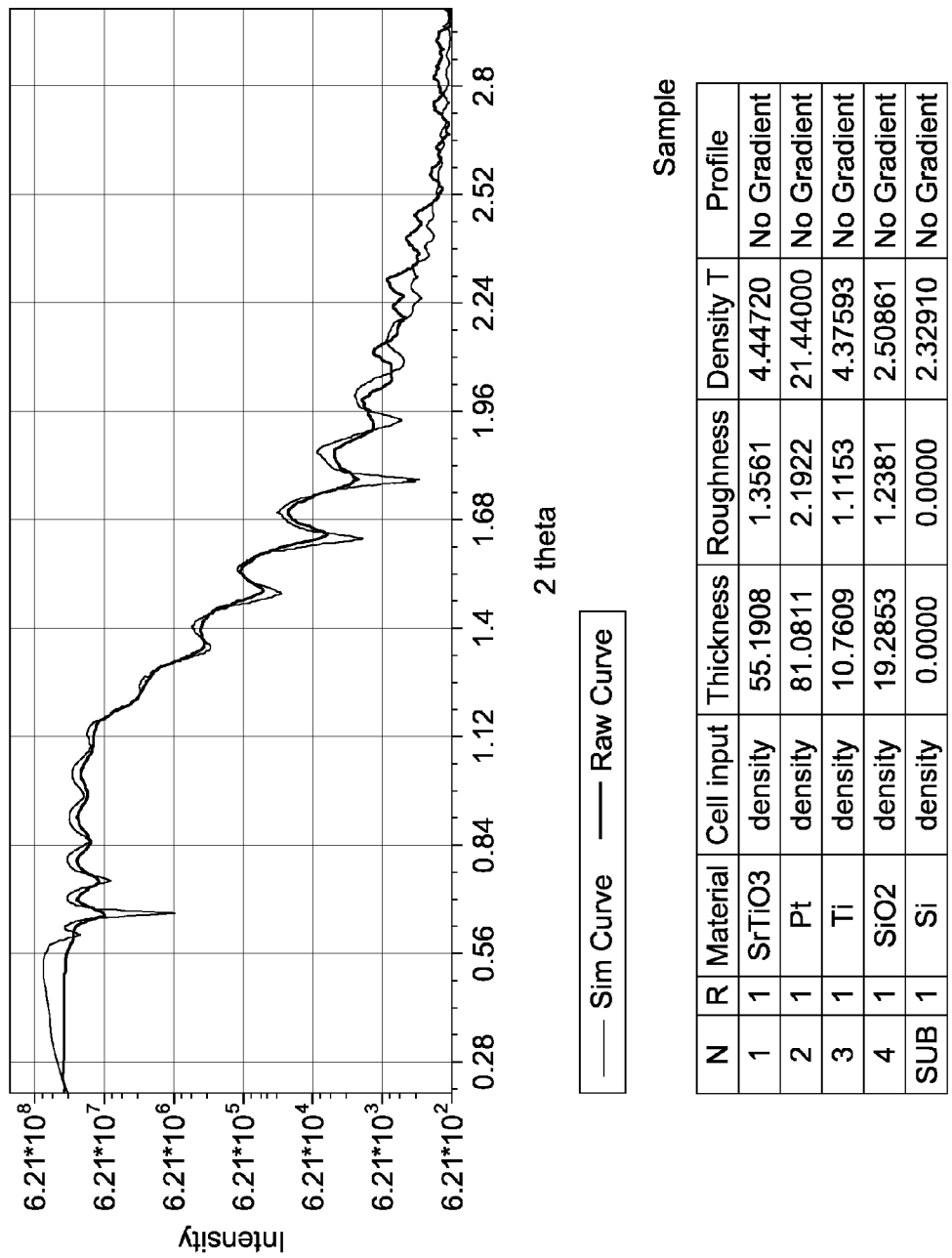
FIG. 4 provides XRR patterns of a STO/Pt/Ti/SiO$_2$/Si stack annealed for 60 min in air at 600° C. Thickness and roughness values are in nanometers and film density in grams per cubic centimeter.

The smoothness of the interfaces was studied by XRR analysis, as shown in FIGS. 3 and 4. The RMS roughness of the as deposited STO surface was 1.62 nm, slightly smaller than the roughness of the STO/Pt interface, 2.02 nm. After PDA in air at 600° C., the XRR roughness of the STO/Pt interface increased slightly to 2.19 nm, but the roughness of the STO surface decreased slightly to a value of 1.36 nm.

Figure 5:
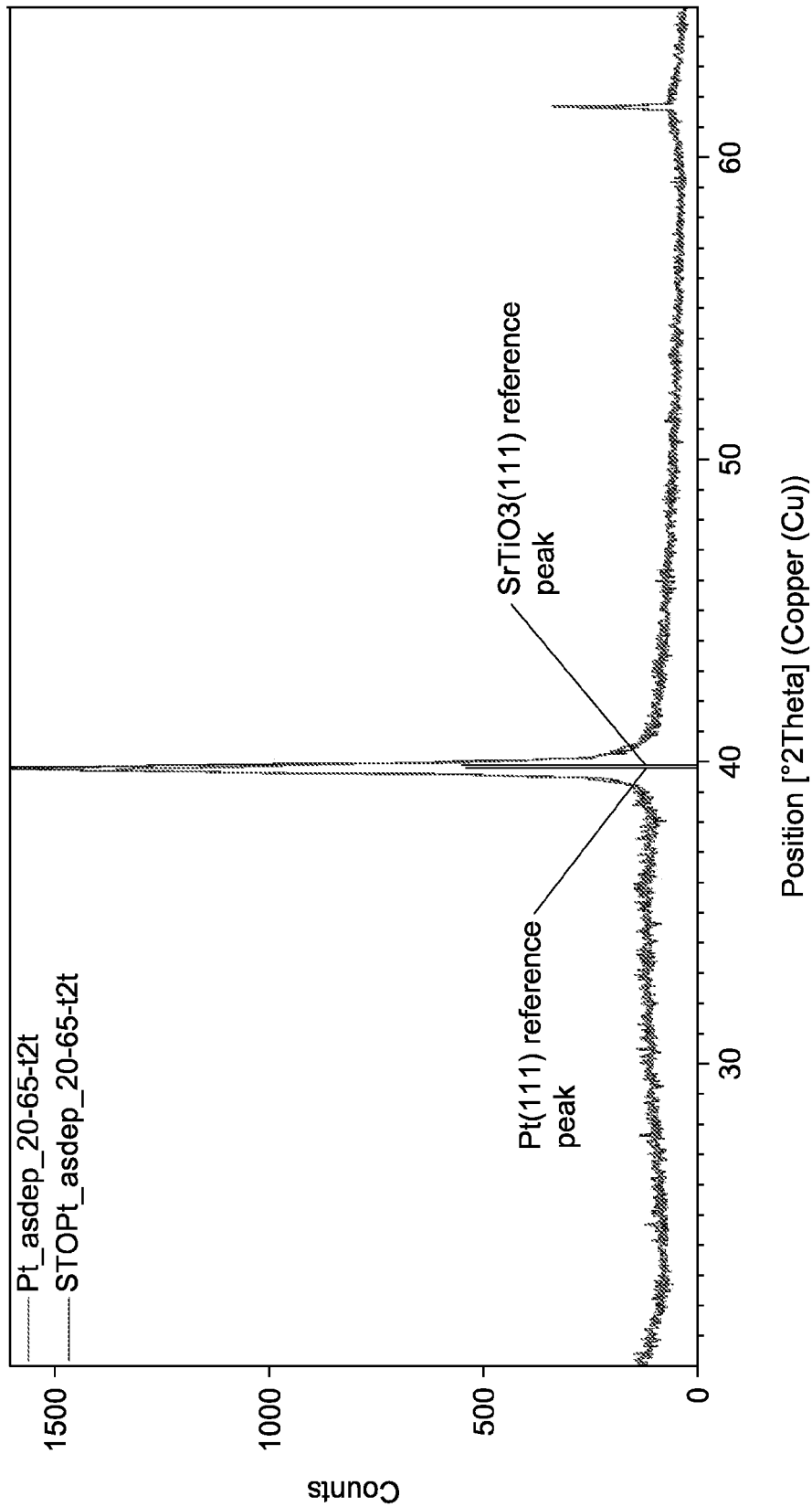
FIG. 5 shows the results of XRD θ-2θ spectral analysis on the wafer of FIG. 2 before crystallization of the strontium titanate.
Figure 6:
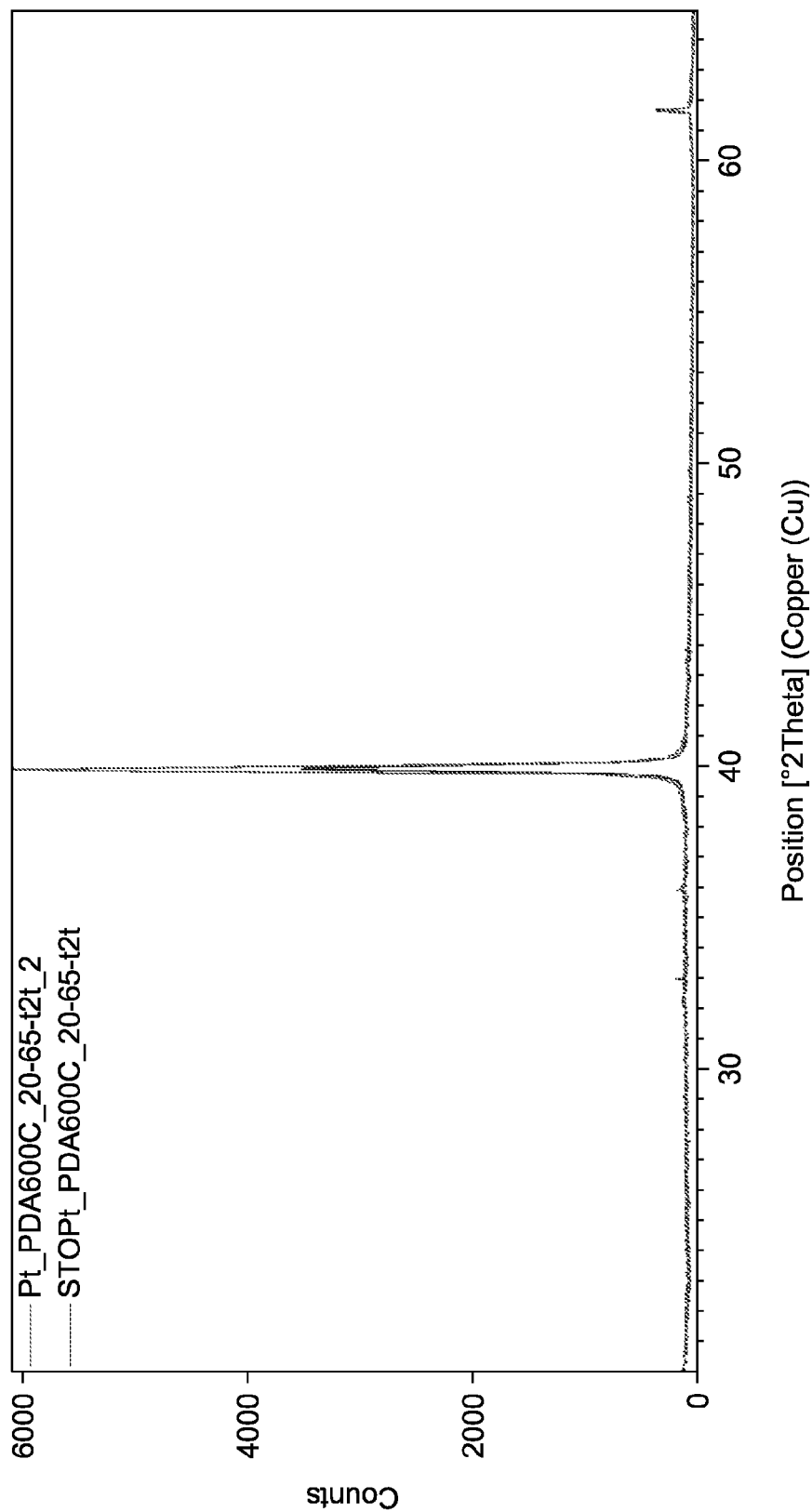
FIG. 6 shows the results of XRD θ-2θ spectral analysis on the wafer of FIG. 2 after crystallization of the strontium titanate.
Figure 7:
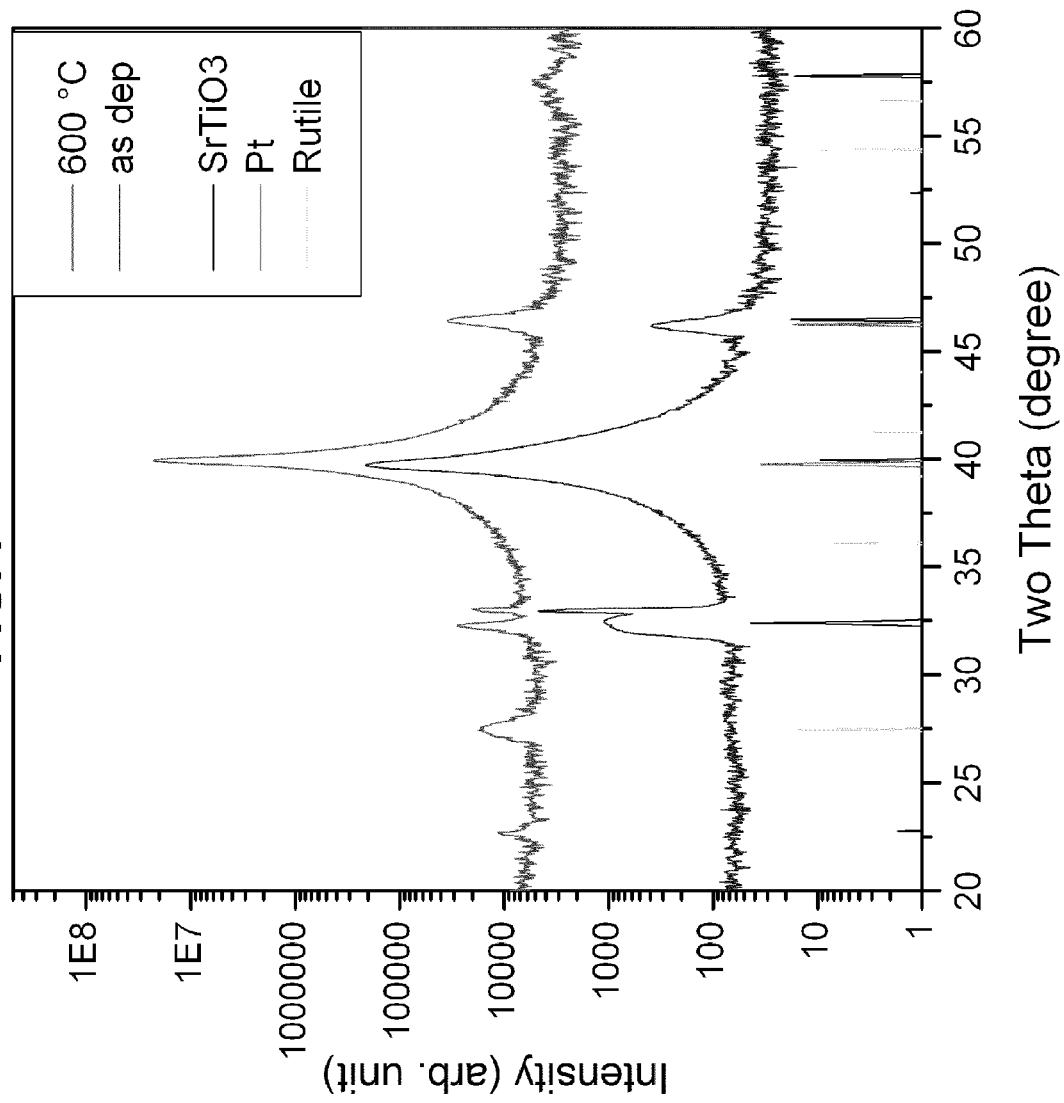
FIG. 7 XRD θ-2θ patterns of the STO/Pt/Ti/SiO$_2$/Si stacks as deposited and after annealing for 60 min in air.

FIGS. 5-7 show XRD analysis of the STO/Pt/Ti/SiO2/Si stacks before and after the post deposition anneal. From FIG. 7 it can be seen that the Pt film was oriented with strong {111} orientation shown by the intensive peak at ~40° in the θ-2θ scan. After 600° C. in air post deposition anneal, the {001} peak for $SrTiO_3$ became visible, also an additional peak at ~27.5° was found. This peak was identified as a possible peak for $TiO_2$ rutile, indicating that either the crystallization of the STO layer started with $TiO_2$ rutile formation, or some oxygen was scavenged from the STO layer, diffused through the platinum layer and formed a thin $TiO_2$ layer at the interface of the titanium adhesion layer under the platinum layer. Yet another possibility is that titanium diffused through the platinum layer and reacted with the oxygen at the STO/Pt interface forming the $TiO_2$ rutile layer. However, there was no evidence of an additional interface layer between the STO and Pt in the cross sectional TEM images, presented in FIGS. 8 and 9. Therefore, the more likely origin of the $TiO_2$ rutile peak in the XRD pattern is the oxidation of the titanium adhesion layer under the platinum layer during the 600° C. PDA step in air.

Figure 8:
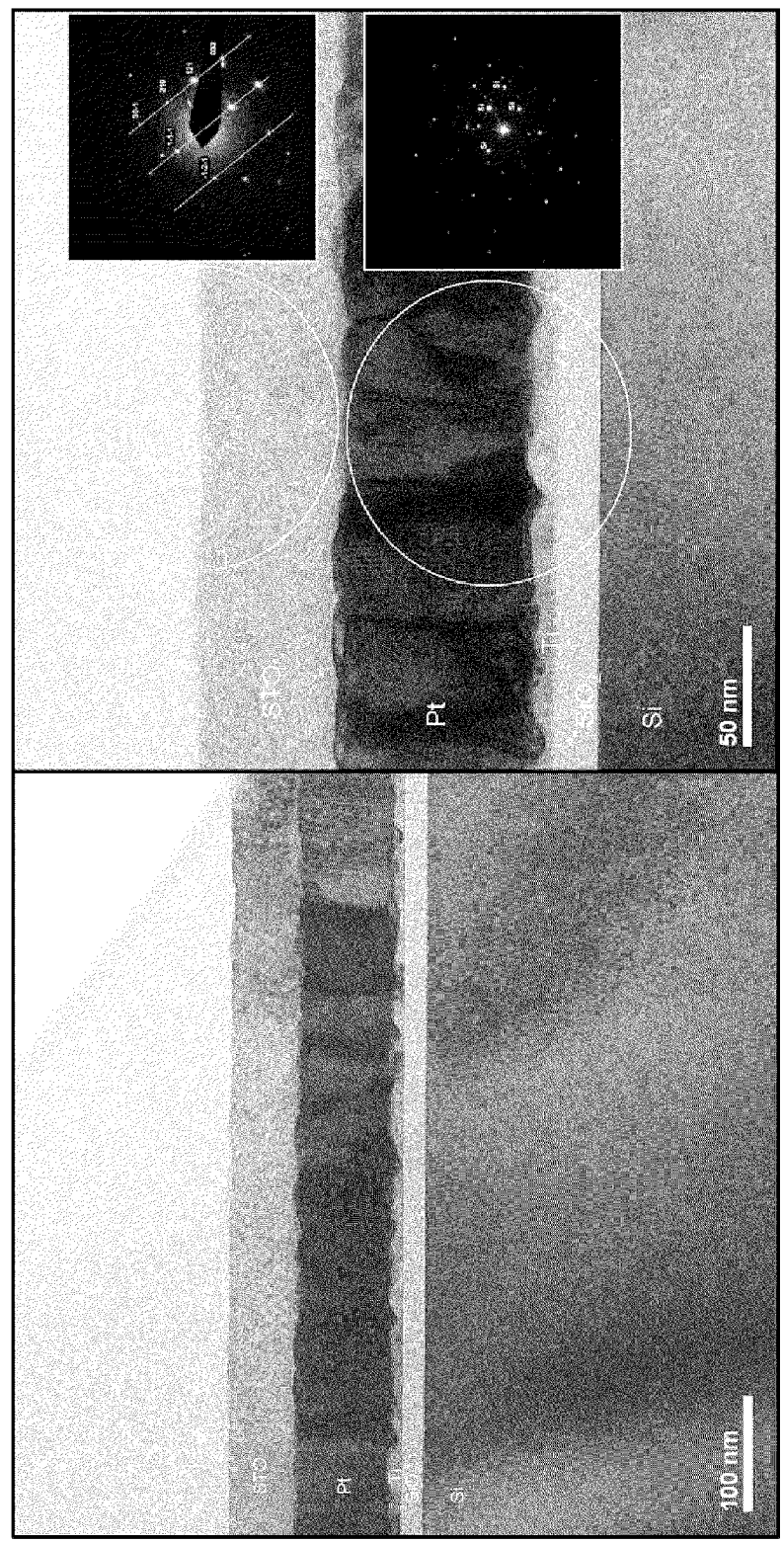
FIG. 8 shows cross-sectional TEM images of the SrTiO$_3$/Pt/Ti/SiO$_2$/Si stack on the wafer of FIG. 2 after crystallization anneal. ED patterns are shown for the circled areas in the cross section.
Figure 9:
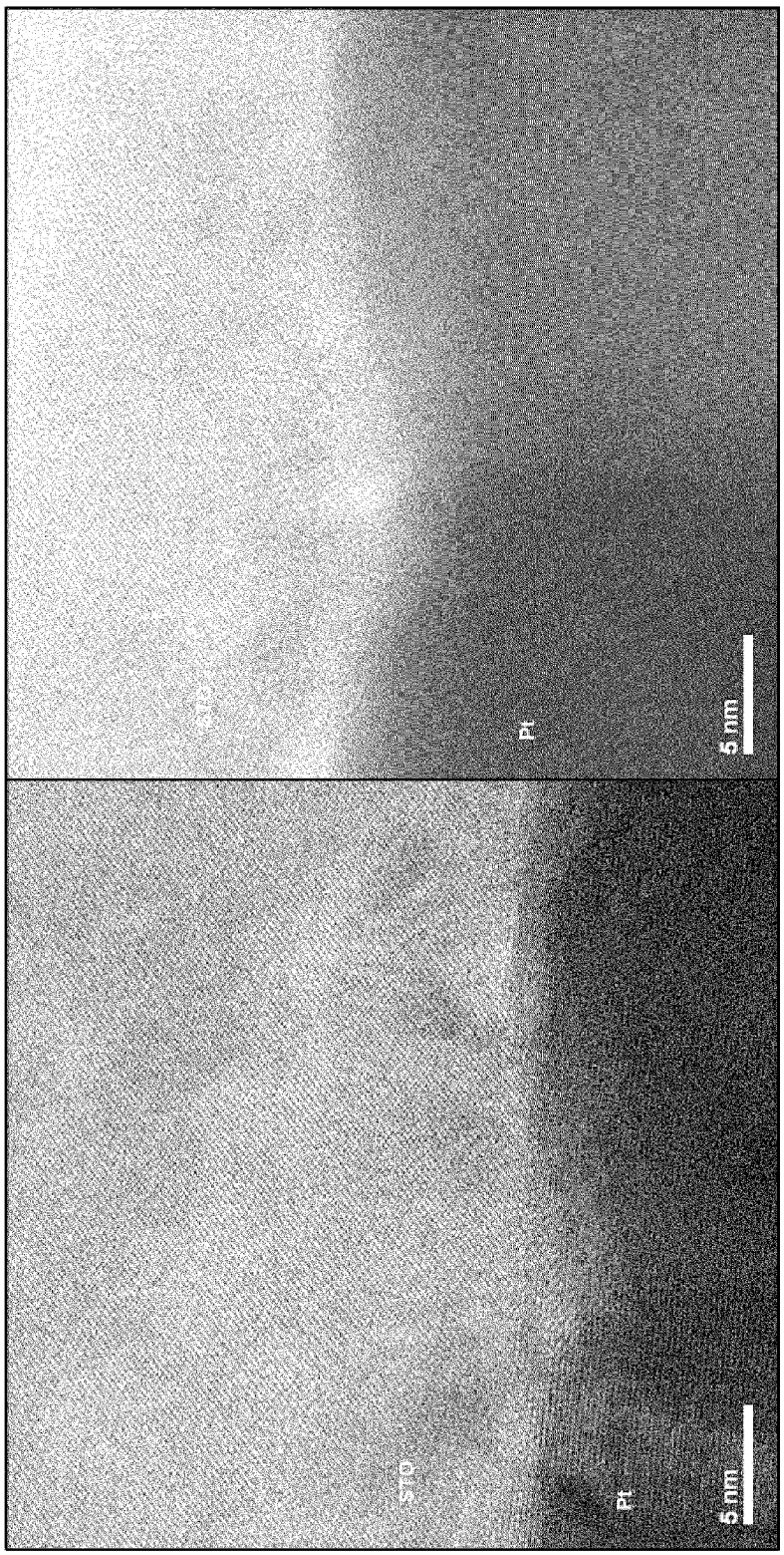
FIG. 9 shows cross sectional HRTEM images of the annealed STO/Pt/Ti/SiO$_2$/Si stack showing the atomic arrangement at the STO/Pt interface. Note that the Pt grain boundary is not mirrored in the overlying STO layer.
Figure 10:
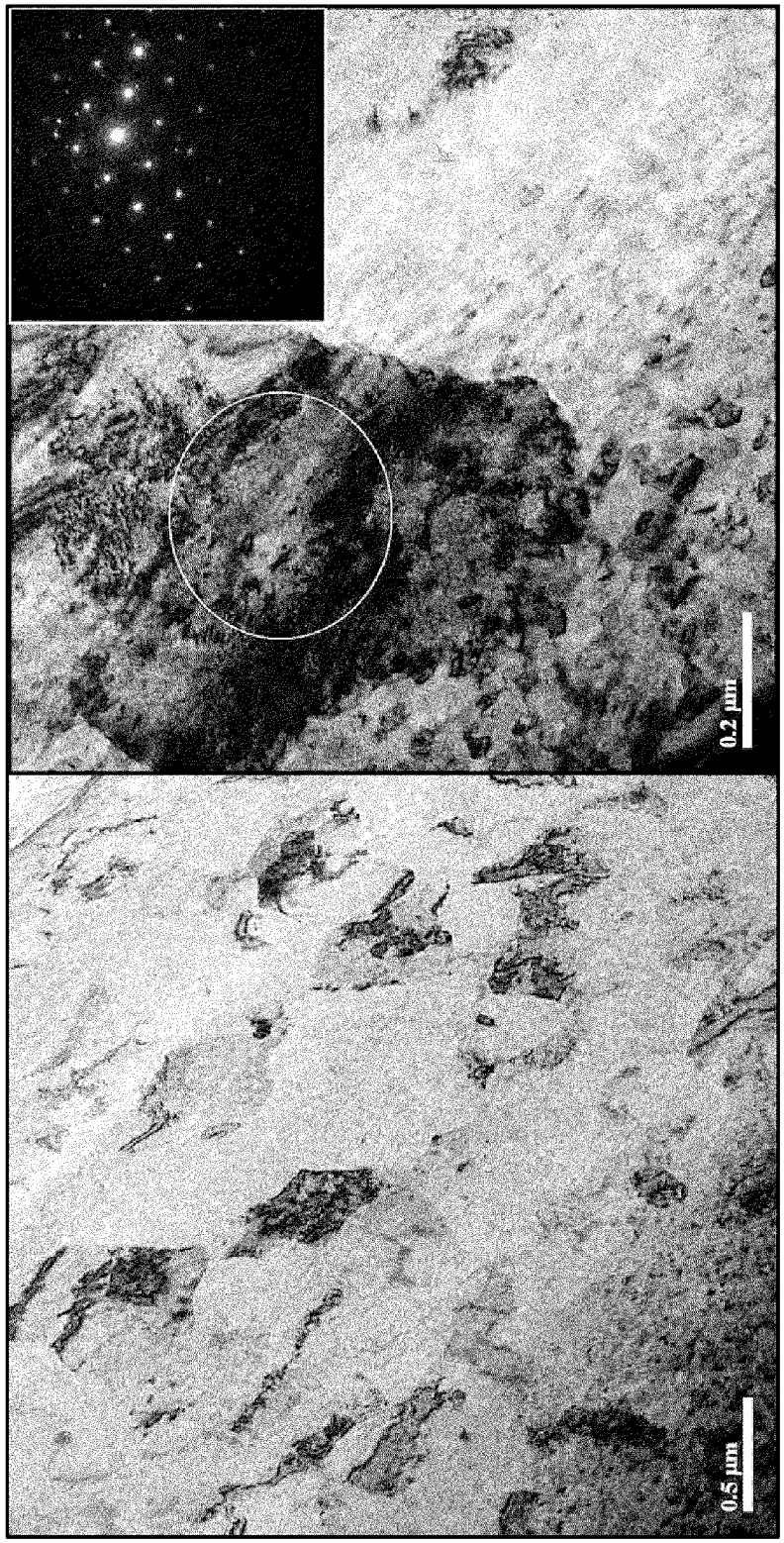
FIG. 10 provides plan view TEM images of the annealed 60 nm thick STO layer. The large lateral grain size is shown. ED pattern of the circled area is shown in the insert.
Figure 11:
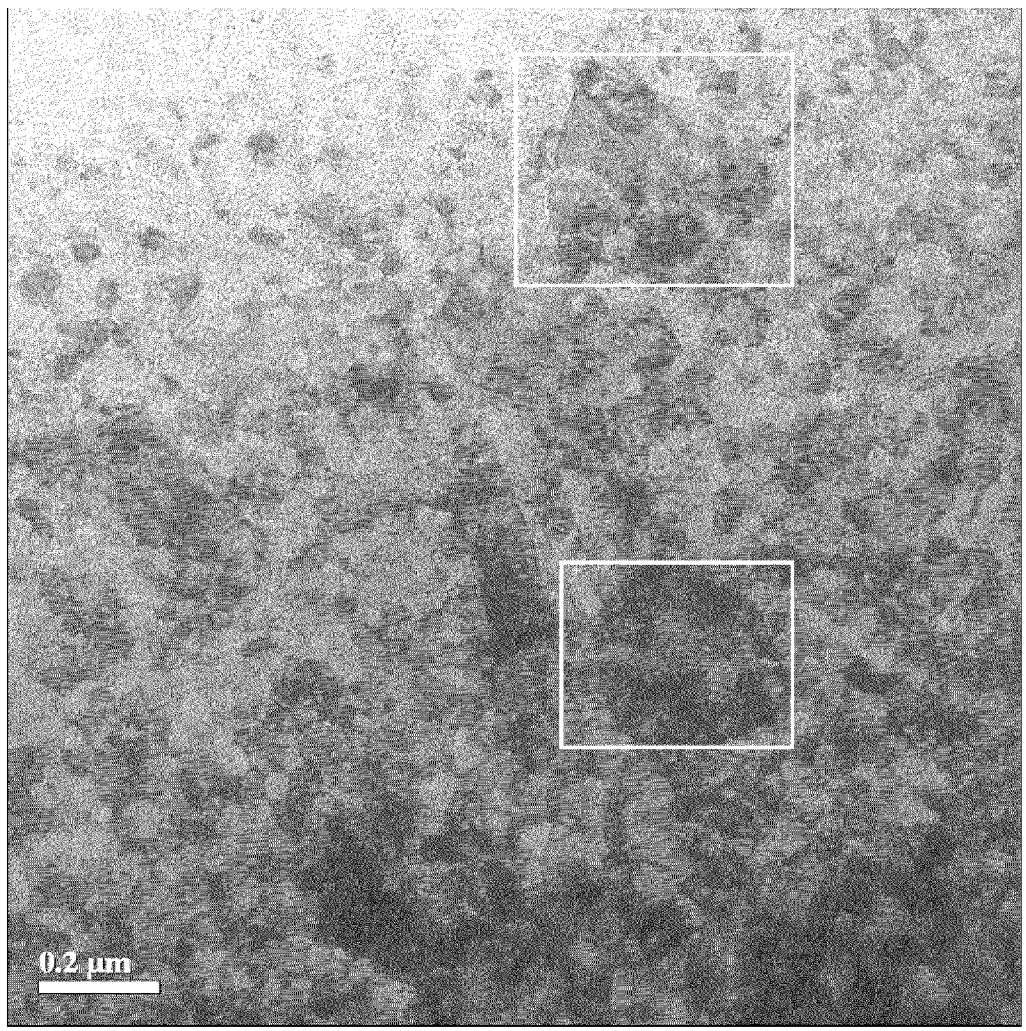
FIG. 11 provides a plan view TEM image of a thicker TEM sample including both the STO and Pt layers. Two STO grains superimposed on the Pt grains are indicated.

The TEM images in FIG. 8 reveal extremely smooth STO layers with large lateral grain sizes. The Pt grain boundaries clearly visible in the TEM images are not mirrored in the STO layer. This, and the atomic arrangement at the STO/Pt interface, shown in the high resolution transmission electron microscope (HRTEM) images in FIG. 9, suggests that the relationship between STO and Pt is not epitaxial. It appears that the STO layer has crystallized into relatively large single crystal domains, but do not copy the atomic arrangement, or the morphology of the underlying Pt layer. To get an idea of the domain size of the STO film, a plan view TEM analysis was done. These images are presented in FIGS. 10 and 11. From these figures, it can be concluded that the lateral size of the STO crystals was approximately an order of magnitude larger than the 60 nm film thickness.

Figure 12:
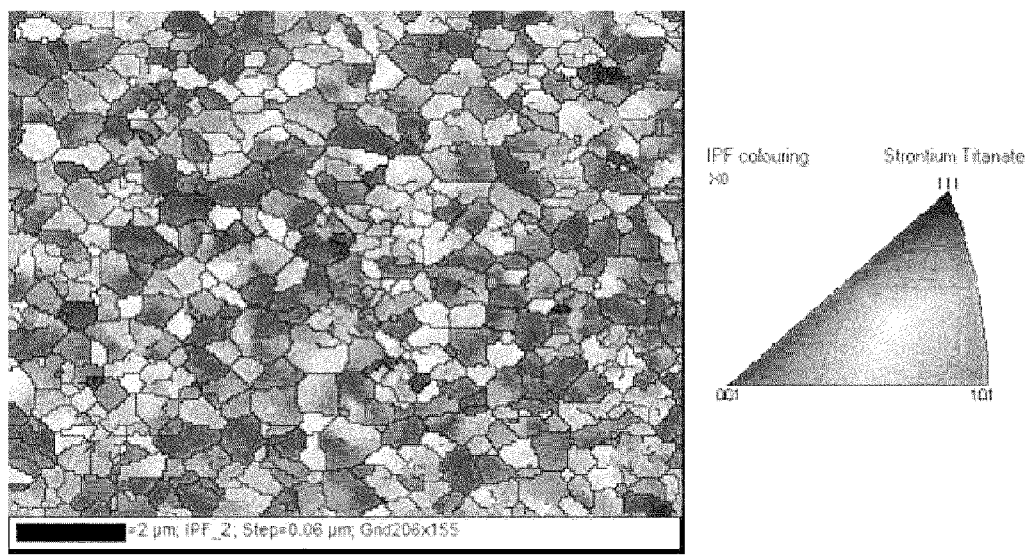
FIG. 12 is a EBSD surface normal-projected inverse pole figure orientation map of the 60 min in air annealed STO layer. Shading refers to the lattice plane parallel to the sample surface.
Figure 13:
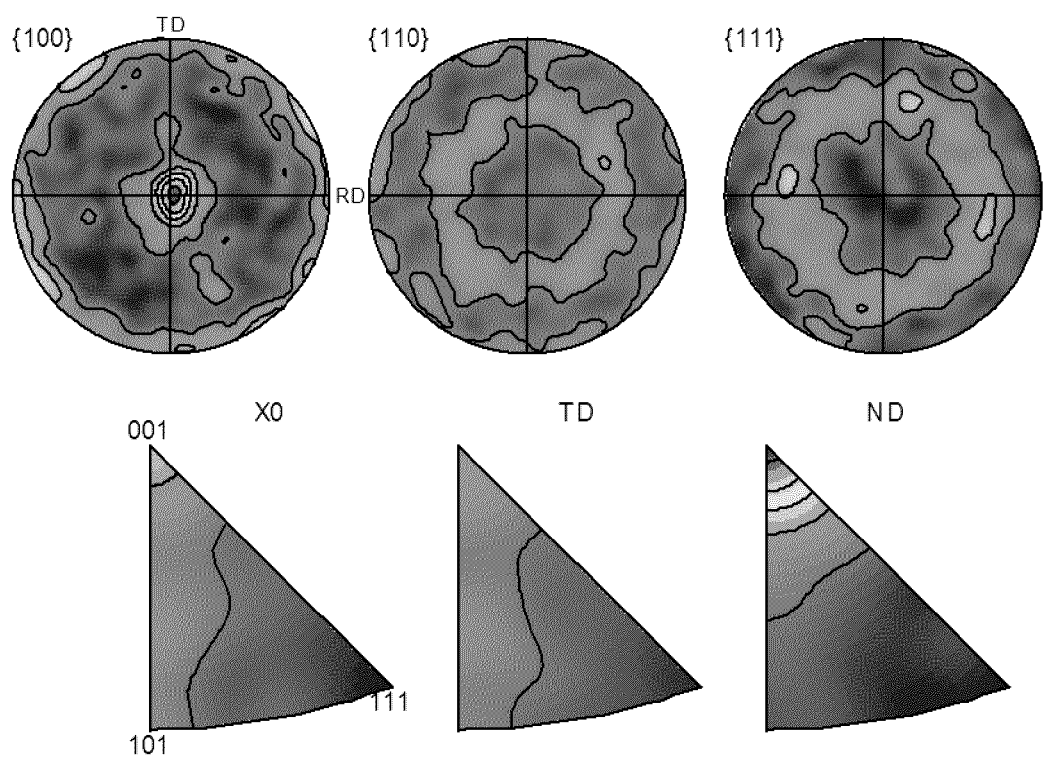
FIG. 13 shows EBSD pole and inverse pole figures of the 60 min in air annealed STO layer, showing mainly {001} orientation of the film.

The orientations of the individual grains were studied with EBSD analysis. These results are presented in FIGS. 12 and 13. The grains were found to be generally oriented with {001} plane parallel to the substrate surface, but some of the grains had also {111} or {101} orientation. Some misorientations were also seen as indicated by the shades of the grains in the EBSD map in FIG. 12. Pole figures and inverse pole figures, shown in FIG. 13, confirmed the orientation distribution of the grains to be mostly {001}.

Large lateral STO grains compared to the film thickness have also been observed on TiN bottom electrodes using an $H_2O$ based ALD-STO process. However, these films were not reported to have preferential orientation of the grains.

The results indicate that ALD grown STO can be crystallized into relatively large single crystal domains on {111} Pt electrodes during post deposition annealing. Careful control of the growth process and Sr rich composition to match the lattice parameter of Pt, enables the formation of mostly {001} oriented STO grains with very smooth surfaces and lateral grain sizes an order of magnitude larger than the film thickness. Although the STO films were mostly oriented with {001}/{111} relation with Pt, they did not show epitaxial relation with Pt. Neither the morphology, nor the atomic arrangement of the underlying Pt electrode was transferred in the overlying STO layer.

Without wishing to be held to a particular theory, these results may be related to the excellent lattice match and weak bonding energy of the platinum layer with the STO layer. During PDA, the Sr, Ti and O atoms can move relatively freely on top of the Pt electrode, because none of the atoms form strong bonds with platinum. Therefore, minimization of the STO surface energy may influence the crystallization more than the minimization of the strain energy. This can lead to abnormal grain growth with some texture preferred. Theoretical predictions have suggested that the minimum energy surface for $SrTiO_3$ is the {100} plane. The results disclosed herein are in agreement with these theoretical predictions.

Various modifications, omissions and additions may be made to the methods and structures described above without departing from the scope of the invention. All such modifications and changes are intended to fall within the scope of the invention, as defined by the appended claims.

I claim:

1. A method of forming crystalline oxides comprising:
    providing a substrate;
    depositing a strontium titanate layer on the substrate by atomic layer deposition; and
    subjecting the strontium titanate layer to a post-deposition anneal (PDA) under conditions selected to produce large single crystal domains in the strontium titanate layer,
    wherein the strontium titanate layer has a thickness, and wherein subjecting the strontium titanate layer to the PDA comprises forming single crystal domains having lateral dimensions exceeding the thickness by at least a factor of two.

2. The method of claim 1, wherein subjecting the strontium titanate layer to the PDA comprises forming single crystal domains having lateral dimensions exceeding the thickness by a factor of five.

3. The method of claim 1, wherein providing the substrate comprises providing an exposed crystal enhancement layer over a wafer.

4. The method of claim 3, wherein the crystal enhancement layer comprises a noble metal layer.

5. The method of claim 4, wherein the crystal enhancement layer comprises a platinum layer.

6. The method of claim 3, further comprising cleaning the crystal enhancement layer prior to depositing the strontium titanate layer by ALD.

7. The method of claim 1, further comprising, after subjecting the strontium titanate layer to the PDA, heteroepitaxially depositing a functional oxide thereover.

8. The method of claim 7, wherein the functional oxide comprises a lanthanum aluminate ($LaAlO_3$).

9. The method of claim 1, wherein the PDA is conducted at a temperature of 350° C. to 800° C.

10. The method of claim 1, wherein the PDA is conducted at a temperature between about 500° C. and 600° C.

11. The method of claim 1, wherein the PDA is conducted at a temperature of less than 500° C. for a period of between 1 minute and 24 hours.

12. The method of claim 1, wherein the PDA is conducted at a temperature of greater than 600° C. for a period of between 1 second and 10 minutes.

13. The method of claim 12, wherein the PDA is conducted for a period of between 1 second and 60 seconds.

14. The method of claim 1, wherein the PDA is conducted in an atmosphere selected from $N_2$, $H_2$, forming gas, $O_2$, air, Ar, He and mixtures thereof.

15. The method of claim 1, wherein the PDA is conducted at a temperature of about 600° C. for about 60 minutes in air.

16. The method of claim 1, wherein providing a substrate comprises providing a self-assembled monolayer with periodic openings exposing an underlying Pt layer.

17. The method of claim 1, wherein the single crystal domains are between 0.2 μm and 1 μm in width.

18. The method of claim 1, wherein the strontium titanate layer has a roughness of less than 2 nm rms following the post deposition anneal.

\* \* \* \* \*